(12) United States Patent
Yasunori et al.

(10) Patent No.: US 6,417,619 B1
(45) Date of Patent: Jul. 9, 2002

(54) FRONT PANEL BOARD FOR PLASMA DISPLAY

(75) Inventors: Yukio Yasunori; Hakaru Miyakita; Kayoko Ueda; Haruyoshi Sannou, all of Osaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/402,716
(22) PCT Filed: Apr. 9, 1998
(86) PCT No.: PCT/JP98/01630
§ 371 (c)(1), (2), (4) Date: Oct. 8, 1999
(87) PCT Pub. No.: WO98/45828
PCT Pub. Date: Oct. 15, 1998

(30) Foreign Application Priority Data

| Apr. 10, 1997 | (JP) | 9-092041 |
| Apr. 30, 1997 | (JP) | 9-112553 |
| Jul. 14, 1997 | (JP) | 9-188181 |
| Jul. 31, 1997 | (JP) | 9-206152 |

(51) Int. Cl.[7] .............................................. H01J 17/49
(52) U.S. Cl. .................. 313/582; 313/477 R; 313/479; 313/495; 174/35 MS; 174/35 R
(58) Field of Search ................................. 313/582, 586, 313/587, 313, 479, 446, 635, 112, 495–497, 497 R; 315/85; 174/35 MS, 35 R

(56) References Cited

U.S. PATENT DOCUMENTS

| 4,247,737 A | * | 1/1981 | Johnson et al. ........ 174/35 MS |
| 4,412,255 A | | 10/1983 | Kuhlman et al. |
| 4,732,454 A | | 3/1988 | Saito et al. |
| 4,755,716 A | * | 7/1988 | Hayafune et al. ........... 313/479 |
| 4,853,790 A | * | 8/1989 | Dickie ........................ 313/479 |
| 4,853,791 A | | 8/1989 | Ginther, Jr. |
| 4,868,033 A | * | 9/1989 | Nakamo et al. ........ 174/35 MS |
| 4,943,862 A | * | 7/1990 | Uesaka et al. ............... 313/479 |
| 4,945,282 A | * | 7/1990 | Kawamura et al. ......... 313/479 |
| 5,051,652 A | * | 9/1991 | Isomura et al. ............. 313/479 |
| 5,099,171 A | * | 3/1992 | Daiku et al. ................. 313/479 |
| 5,404,073 A | * | 4/1995 | Tong et al. .................. 313/479 |
| 5,743,778 A | * | 4/1998 | Arimoto et al. ................ 445/8 |
| 5,811,923 A | * | 9/1998 | Zieba et al. ................. 313/479 |
| 5,841,227 A | * | 11/1998 | Terpin ........................ 313/479 |
| 5,959,399 A | * | 9/1999 | Arimoto et al. ............. 313/479 |
| 5,961,893 A | * | 10/1999 | Honda et al. ............... 313/479 |

FOREIGN PATENT DOCUMENTS

| JP | 62051140 | 3/1987 |
| JP | U 6268368 | 4/1987 |
| JP | U-6268368 | 4/1987 |
| JP | A 62147799 | 7/1987 |
| JP | U 1101278 | 7/1989 |
| JP | U-1101278 | 7/1989 |

(List continued on next page.)

Primary Examiner—Nimeshkumar D. Patel
Assistant Examiner—Mariceli Santiago
(74) Attorney, Agent, or Firm—Birch, Stewart, Kolasch & Birch, LLP

(57) ABSTRACT

A front panel for a plasma display panel having at least one transparent resin plate and a conductive mesh placed on the transparent resin plate, in which a part of the conductive mesh is exposed on the plate in a sheet form on at least one side of the marginal surface of the front panel. The front panel may have uneven patterns on at least one side of the surfaces of the front panel, and may also include an intermediate synthetic resin plate between the conductive mesh and the transparent resin plate, as well as a decorative portion between the intermediate synthetic resin plate and the transparent resin plate. In addition, the front panel may contain a conductive film, which is in contact with the conductive mesh in a sheet form on at least one side of the marginal surface of the front panel.

22 Claims, 12 Drawing Sheets

FOREIGN PATENT DOCUMENTS

| | | |
|---|---|---|
| JP | A-298998 | 4/1990 |
| JP | A 298998 | 4/1990 |
| JP | A 2146581 | 6/1990 |
| JP | 05315791 | 11/1993 |
| JP | B2 691340 | 11/1994 |
| JP | B2 719551 | 3/1995 |
| JP | A 8183132 | 7/1996 |
| JP | A 9147752 | 6/1997 |
| JP | A 9247583 | 9/1997 |

\* cited by examiner

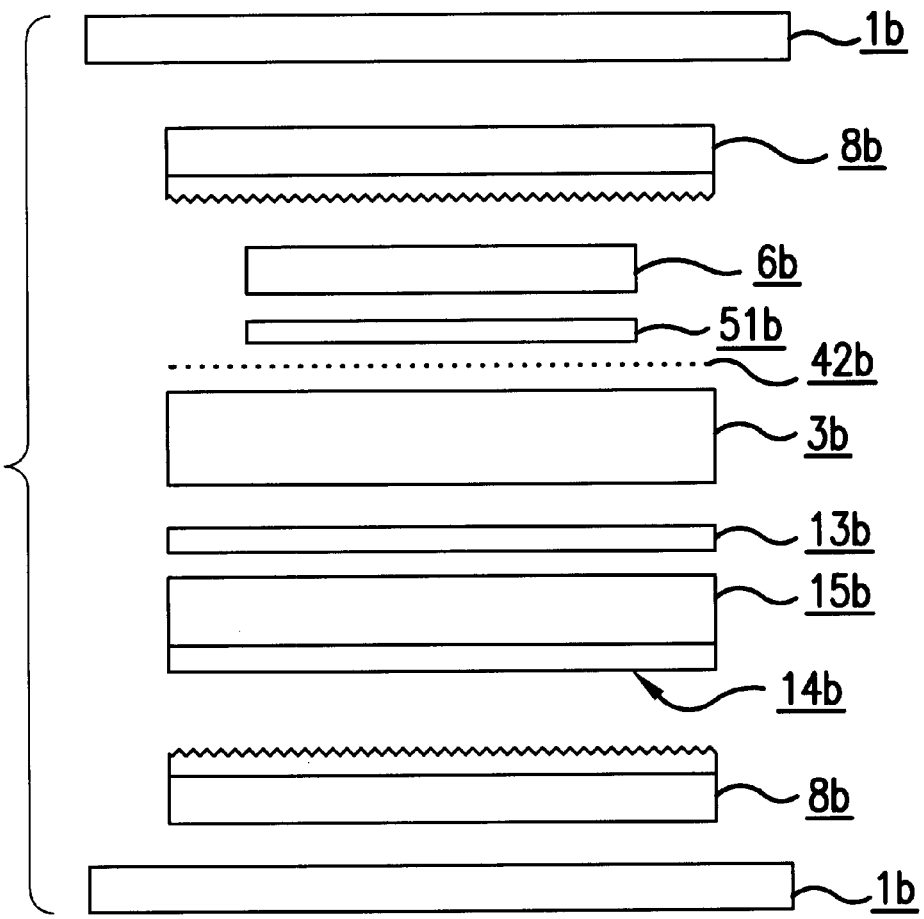
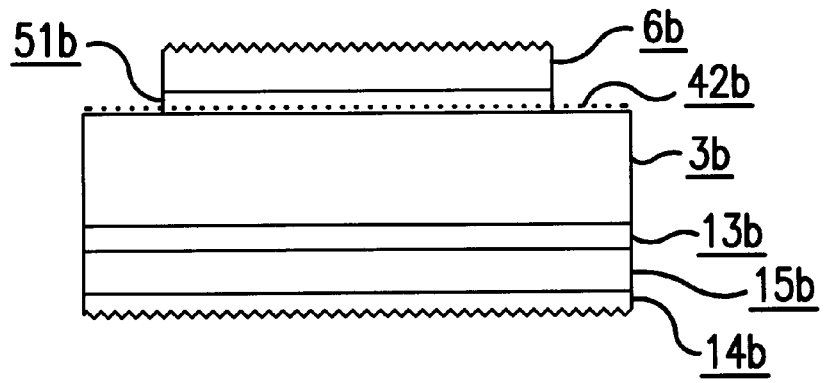

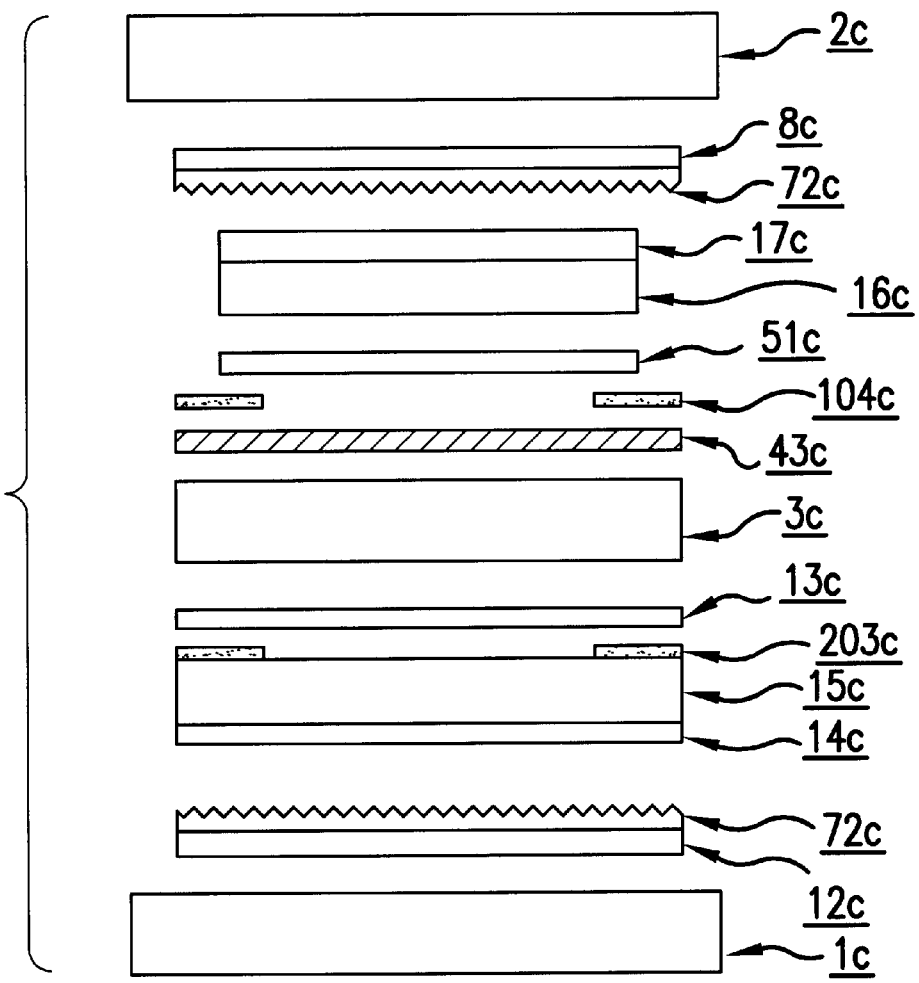
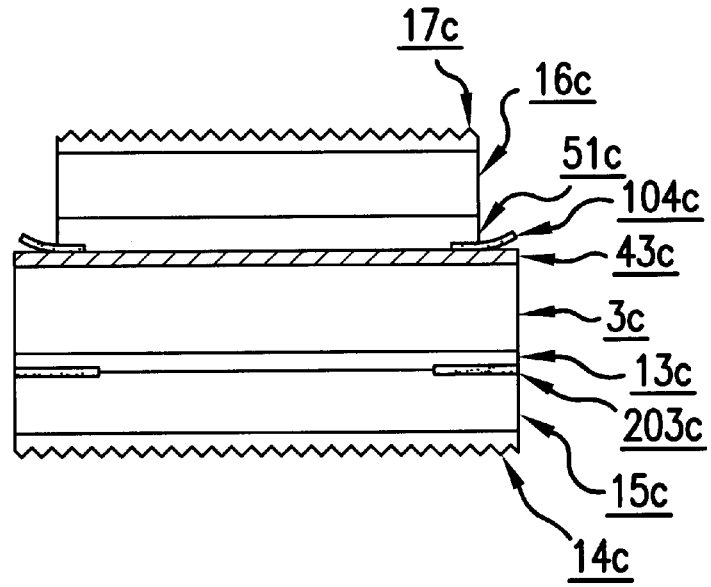

FRONT PANEL BOARD FOR PLASMA DISPLAY

This application is the national phase under 35 U.S.C. §371 of PCT International Application No. PCT/JP98/01630 which has an International filing date of Apr. 9, 1998, which designated the United States of America.

FIELD OF THE INVENTION

The present invention relates to a front panel for a plasma display panel, which is attached to the front face of a plasma display panel and effectively shields electromagnetic waves generated by the plasma display panel.

BACKGROUND OF THE INVENTION

Various computer displays used in office automation instruments and factory automation instruments, and displays of game machines and TVs radiate electromagnetic waves, and the influence of such electromagnetic waves on other equipment may cause problems.

Recently, plasma display panels (hereinafter referred to as "PDP") attract attention as large-size display devices. However, electromagnetic waves generated by PDP often affect surroundings, for example, a FM broadcast picks up noise.

To shield such electromagnetic waves and avoid such an effect affection, various methods have been proposed, for example, a method wherein a filter for a display is utilized, which comprises a plastic substrate and a conductive film such as an indium oxide-tin oxide film formed on the surface of the substrate (JP-B-7-19551), a method wherein a display is covered with a fiber mesh made of polyester fiber metalized with nickel thereon, and a method wherein a filter is utilized, which comprises laminated glass plates and fine metal wires interposed between the plates, and the like.

However, a filter for a display having a conductive film such as an indium oxide-tin oxide film has a low performance of shielding electromagnetic waves and cannot effectively shield the electromagnetic waves. Thus, such a filter does not exhibit sufficient shielding properties against displays which generate intense electromagnetic waves such as PDP.

In the method wherein a display is covered with a mesh made of polyester fiber metalized with nickel thereon, dusts tend to be trapped with the mesh, and thus the screen of the display becomes indistinct for users.

When a filter comprising laminated glass plates and fine metal wires interposed between them is used, the visibility of a screen can be fairly improved, but it is very difficult to ground it, since the fine metal wires are interposed between the glass plates. Therefore, the electromagnetic wave-shielding properties cannot be maintained at a sufficient level for a long time.

SUMMARY OF THE INVENTION

In view of such circumstances, the present inventors made extensive research on front panels having electromagnetic wave-shielding properties, and have found that a front panel for a plasma display plate, which comprises a transparent resin plate and a conductive mesh placed thereon wherein a part of the conductive mesh is exposed in a sheet form on at least one side of the periphery of the front panel, can surely be grounded, stably exhibits high electromagnetic wave-shielding properties, and makes the screen of the display sufficiently visible. Thus, the present invention has been completed.

According to the first aspect, the present invention provides a front panel for a plasma display panel comprising at least one transparent resin plate and a conductive mesh placed on said transparent resin plate, in which a part of the conductive mesh is exposed on the plate in a sheet form on at least one side of the marginal surface of the front panel.

According to the second aspect, the present invention provides a front panel for a plasma display panel according to the first aspect, in which uneven patterns (asperity) are formed on at least one side of surfaces of the front panel.

According to the third aspect, the present invention provides a front panel for a plasma display panel according to the first aspect, which further comprises an intermediate synthetic resin plate placed between the transparent resin plate and the conductive mesh, and a decorative portion provided between the intermediate synthetic resin plate and the transparent resin plate.

According to the fourth aspect, the present invention provides a front panel for a plasma display panel according to the first aspect, which further comprises a conductive film, a part of which is in contact with the conductive mesh in a sheet form on at least one side of the marginal surface of the front panel.

According to the fifth aspect, the present invention provides a front panel for a plasma display panel according to the first aspect, in which the transparent resin plate has properties of shielding near-infrared rays.

BRIEF DESCRIPTION OF THE DRAWINGS

FIG. 1-*b* shows a layer arrangement in the course of heat press processing in Example 1-b.

FIG. 2-*b* is a cross sectional view showing the layer structure of a front panel for a plasma display panel produced in Example 1-b.

FIG. 1-*c* shows a layer arrangement in the course of heat press processing in Example 1-c.

FIG. 2-*c* is a cross sectional view showing the layer structure of a front panel for a plasma display panel produced in Example 1-c.

FIG. 3-c shows a layer arrangement in the course of heat press processing in Example 2-c.

FIG. 4-c is a cross sectional view showing the layer structure of a front panel for a plasma display panel produced in Example 2-c.

FIG. 5-c shows a layer arrangement in the course of heat press processing in Example 3-c.

FIG. 6-c is a cross sectional view showing the layer structure of a front panel for a plasma display panel produced in Example 3-c.

FIG. 7-c shows a layer arrangement in the course of heat press processing in Comparative Example 1-c.

FIG. 8-c is a cross sectional view showing the layer structure of a front panel produced in Comparative Example 1-c.

FIG. 1-d is a top view showing the arrangement of a transparent resin plate and a conductive film in the present invention.

FIG. 2-d is a top view showing another arrangement of a transparent resin plate and a conductive film in the present invention.

FIG. 3-d is a cross sectional view showing a further arrangement of a transparent resin plate and a conductive film in the present invention.

FIG. 4-d shows a layer arrangement in the course of heat press processing in Example 1-d.

FIG. 5-d is a cross sectional view showing the layer structure of a front panel for a plasma display produced in Example 1-d.

FIG. 6-d is shows a layer arrangement in the course of heat press processing in Example 2-d.

FIG. 7-d is a cross sectional view showing the layer structure of a front panel for a plasma display produced in Example 2-d.

FIG. 8-d is shows a layer arrangement in the course of heat press processing in Example 3-d.

FIG. 9-d is a cross sectional view showing the layer structure of a front panel for a plasma display produced in Example 3-d.

FIG. 10-d is shows a layer arrangement in the course of heat press processing in Comparative Example 1-d.

DETAILED DESCRIPTION OF THE INVENTION

Figure 1A:
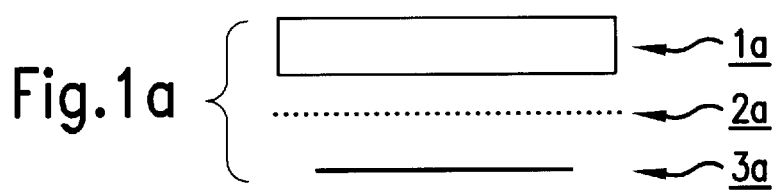
FIG. 1-*a* is an arrangement drawing showing the structure of a front panel for a plasma display panel produced in Example 1-a.
Figure 2A:
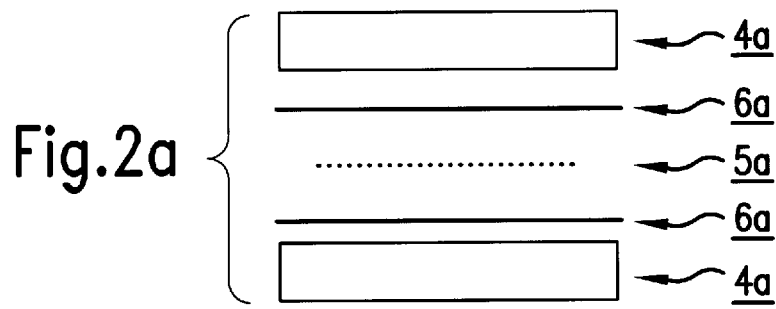
FIG. 2-*a* is an arrangement drawing showing the structure of a front panel produced in Comparative Example 1-a.
Figure 1B:
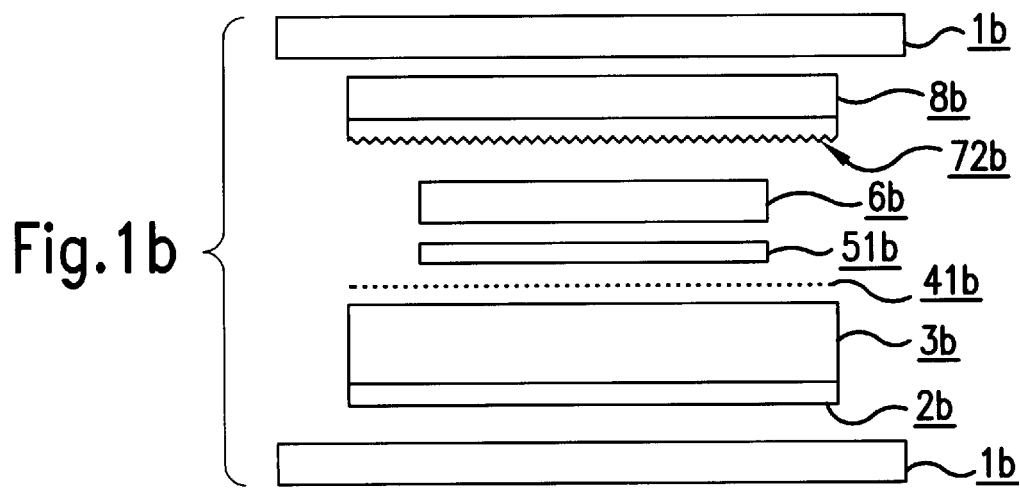
Figure 2B:
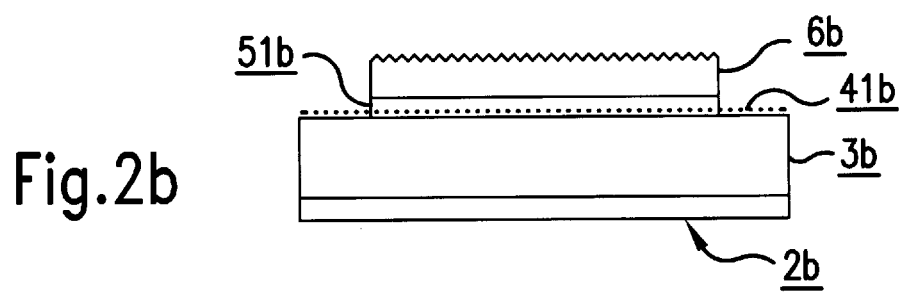

The front panel of the present invention is a front panel for a plasma display panel comprising a transparent resin plate and a conductive mesh placed on the transparent resin plate, in which a part of the conductive mesh is exposed on the plate in a sheet form on at least one side of the marginal surface of the front panel.

Such a front panel is placed in front of display devices such as CRT (cathode ray tubes), EL (electroluminescent) displays, plasma display panels. Preferably, such a front panel is used as a front panel for PDP. The size of the front panel is not limited and is suitably selected depending on the screen size of a display device. Also, the thickness of the front panel can be suitably selected.

A transparent resin plate used in the present invention may be made of a resin such as acrylic resins, polycarbonate resins, polyester resins, cellulose resins (e.g. triacetylcellulose, diacetylcelluose, etc.), styrene resins, vinyl chloride resins, etc.

Specific examples of such resins include those prepared by polymerizing the following monomers:

(meth)acrylates such as methyl(meth)acrylate, ethyl (meth)acrylate, propyl(meth)acrylate, butyl(meth) acrylate, 2-ethylhexyl(meth)acrylate, etc.;

(meth)acrylates having an alicyclic hydrocarbon group such as bornyl(meth)acrylate, fenchyl(meth)acrylate, 1-menthyl(meth)acrylate, adamantyl(meth)acrylate, dimethyladamantyl(meth)acrylate, cyclohexyl(meth) acrylate, isobornyl(meth)acrylate, tricyclo[$5.2.1.0^{2,6}$] decan-8-yl(meth)acrylate, dicyclopentenyl(meth) acrylate, etc.;

styrenic monomers such as styrene, α-methylstyrene, vinyltoluene, chlorostyrene, bromostyrene, etc.;

unsaturated carboxylic acids such as acrylic acid, methacrylic acid, maleic acid, itaconic acid, etc.;

acid anhydrides such as maleic anhydride, itaconic anhydride, etc.;

hydroxyl group-containing monomers such as 2-hydroxyethyl(meth)acrylate, 2-hydroxypropyl(meth) acrylate, tetrahydrofurfuryl(meth)acrylate, monoglycerol(meth)acrylate, etc.:

nitrogen-containing monomers such as acrylamide, methacrylamide, acrylonitrile, methacrylonitrile, diacetoneacrylamide, dimethylaminoethyl methacrylate, etc.;

epoxy group-containing monomers such as allyl glycidyl ether, glycidyl acrylate, glycidyl methacrylate, etc.;

alkylene oxide group-containing monomers such as polyethylene glycol monomethacrylate, polypropylene glycol monomethacrylate, polyethylene glycol monoallyl ether, etc.;

other monomers such as vinyl acetate, vinyl chloride, vinylidene chloride, vinylidene fluoride, ethylene, etc.

Further examples of transparent resins include those prepared by polymerizing the following polyfunctional monomers:

alkyldiol di(meth)acrylates such as ethylene glycol di(meth)acrylate, 1,4-butanediol di(meth)acrylate, neopentyl glycol di(meth)acrylate, etc.;

alkylene glycol di(meth)acrylates such as tetraethylene glycol di(meth)acrylate, tetrapropylene glycol diacrylate, etc.;

polyfunctional aromatic compounds such as divinylbenzene, diallyl phthalate, etc.;

(meth)acrylates of polyhydric alcohols such as pentaerythritol tetra(meth)acrylate, trimethylolpropane tri (meth)acrylate, etc.

Herein, "(meth)acrylate" means acrylate or methacrylate.

The transparent resin plates in the present invention may be made of copolymers comprising two or more of the above monomers.

The transparent resin plates in the present invention are preferably made of acrylic resins or styrene resins from the viewpoint of light transmission and the easy availability of monomers. In particular, those made of acrylic resins are preferable from the viewpoint of light transmission and weather resistance.

A transparent resin plate used in the present invention may be in the form of a plate, a film or a sheet. The thickness of the resin plate may be suitably selected,. and is usually from 0.01 to 10 mm, preferably from 0.02 to 5 mm.

In the present invention, a plurality of transparent resin plates may be used.

The transparent resin plates in the present invention may contain additives such as light-diffusing agents, colorants, mold-release agents, stabilizers, UV-ray absorbers, antioxidants, anti-static agents, flame-retardants, etc.

When the front panel of the present invention is attached to PDP, the transparent resin plate preferably has properties of shielding near-infrared rays to prevent disturbances caused by near-infrared rays. In the present invention, a preferred transparent resin plate having properties of shielding near-infrared rays has the near-infrared rays-shielding properties such that a total light transmittance in a visible light wavelength ranging between 450 nm and 650 nm is 50% or more, and a light transmittance of 30% or less in a near-infrared wavelength ranges between 800 nm and 1000 nm, when measured with a method of Japanese Industrial Standard (JIS) K 7105A.

Examples of the transparent resin plate having near-infrared rays-shielding properties include known resin plates containing copper compounds, phosphorus compounds, tungsten compounds, etc. in resins (JP-A-62-5190, JP-A-6-73197, JP-A-6-118228 and U.S. Pat. No. 3,647,729), resin plates containing copper compounds and phosphorus compounds, resin plates containing dye type near-infrared absorbers, and the like, One specific example of the resin plate containing a copper compound and a phosphorus compound is a plate made of a resin composition comprising a copolymer prepared by copolymerizing a monomer having an unsaturated double bond and a phosphorus atom-containing monomer, and a compound containing a copper atom.

Examples of such a monomer having an unsaturated double bond include monomers exemplified above. A phosphorus atom-containing monomer may be any monomer as long as it has a radically polymerizable unsaturated double bond and a phosphorus atom in the molecule thereof, while a compound of the formula (1):

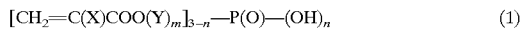

$$[CH_2=C(X)COO(Y)_m]_{3-n}-P(O)-(OH)_n \qquad (1)$$

wherein n is 1 or 2; X is a hydrogen atom or a methyl group; Y is an oxyalkylene group having 2 to 4 carbon atoms; and m is a number of 8 to 20 on a number average when Y is an oxyalkylene group having 2 carbon atoms, or a number of 5 to 20 on a number average when Y is an oxyalkylene group having 3 carbon atoms, or a number of 4 to 20 on a number average when Y is an oxyalkylene group having 4 carbon atoms is preferred, since obtained resin plates have high strength and good durability.

A propylene oxide group having 3 carbon atoms is preferable as an oxyalkylene group for Y in the formula (1), since obtained resin plates have low hygroscopicity.

The total number of carbon atoms in the $[CH_2=C(X)COO(Y)_m]$ group is preferably at least 20 on a number average. When the total number of carbon atoms is not more than 18, obtained resin plates tends to have decreased strength or high hygroscopicity.

In particular, a phosphorus atom-containing monomer of the formula (1) in which Y is a propylene oxide group having 3 carbon atoms and m is a number of 6 to 20 is preferably used.

The amount to be used of such a phosphorous atom-containing monomer is from 0.1 to 50 wt. %, preferably from 0.5 to 30 wt. %, based on the weight of the copolymer of a monomer having an unsaturated double bond and a phosphorus atom-containing monomer. When the amount of the phosphorous atom-containing monomer is less than 0.1 wt. %, good near-infrared rays-shielding properties may not be attained. When the amount of the phosphorous atom-containing monomer exceeds 50 wt. %, the strength of obtained copolymers unpreferably deteriorates.

Two or more phosphorous atom-containing monomers may be used in combination.

Copolymers comprising a monomer having an unsaturated double bond and a phosphorus atom-containing monomer may be prepared by polymerizing such monomers by a conventional polymerization method such as bulk polymerization, suspension polymerization, emulsion polymerization, etc.

As a compound containing a copper atom, any compound may be used insofar as it contains a copper atom.

Examples of the compound containing a copper atom include salts of carboxylic acids with a copper ion such as copper acetate, copper formate, copper propionate, copper valerate, copper hexanoate, copper octylate, copper decanoate, copper laurate, copper stearate, copper 2-ethylhexanoate, copper naphthenate, copper benzoate, copper citrate, etc.; complex salts of acetylacetone or acetoacetic acid with a copper ion; copper chloride; copper pyrophosphate; etc.

The amount to be used of the compound containing a copper atom is from 0.01 to 30 parts by weight, preferably from 0.1 to 20 parts by weight, based on 100 parts by weight of the copolymer of a monomer having an unsaturated double bond and a phosphorus atom-containing monomer.

The above amounts correspond to about 0.05 to 10 moles of a phosphorus atom-containing compound per 1 mole of a compound containing a copper atom.

The above resin composition may be prepared by homogeneously dissolving a compound containing a copper atom in the mixture of a monomer having an unsaturated double bond and a phosphorus atom-containing compound, or a syrup containing such monomers and a polymer or a copolymer of such monomers, and then polymerizing the mixture or the syrup to cure it in a cell or a mold to shape it, or by bulk polymerizing the mixture or the syrup.

The polymerization in the above case can be carried out by any conventional method, for example, polymerization in the presence of a known radical polymerization initiator or a redox polymerization initiator comprising a radical polymerization initiator and an accelerator, or polymerization by the irradiation of UV rays or radiation, and the like.

Alternatively, any method can be conducted as long as it can polymerize the monomers after homogeneous mixing may be employed, for example, a method wherein a compound containing a copper atom is homogeneously compounded in the granular copolymer of a monomer having an unsaturated double bond and a phosphorus atom-containing compound by a conventional melting and kneading method, and then polymerizing the mixture.

Examples of dye type near-infrared absorbers which can be added to resin plates are as follows:

(1) aminium type near-infrared absorbers such as those disclosed in JP-A-4-174402 and JP-A-4-160037, (2) anthraquinone type near-infrared absorbers such as those disclosed in JP-A-61-115958, JP-A-61-291651, JP-A-62-132963 and JP-A-1-172458 (U.S. Pat. No. 5,342,974), (3) phthalocyanine or naphthalocyanine type near-infrared absorbers such as those disclosed in JP-A-2-138382 (U.S. Pat. No. 5,024,926), JP-A-3-62878 (U.S. Pat. No. 5,124,067), JP-A-5-163440 and JP-A-6-214113, (4) dithiol complex type near-infrared absorbers such as those disclosed in JP-A-61-277903, JP-A-61-57674, JP-A-62-158779, JP-A-63-139303 (U.S. Pat. No. 4,913,846), JP-A-1-114801 and JP-B-4-45547 (U.S. Pat. No. 4,730,902), (5) polymethine type near-infrared absorbers, pyrylium type near-infrared absorbers, thiopyrylium type near-infrared absorbers, squarilium type near-infrared absorbers, chloconium type near-infrared absorbers, azulenium type near-infrared absorbers, tetradehydrocholine type near-infrared absorbers, triophenylmethane type near-infrared absorbers, diimmonium type near-infrared absorbers, and the like.

Two or more of the above dye type near-infrared absorbers may be used in combination.

Specific but non-limiting examples of the dye type near-infrared absorbers include (1) IR-750, IRG-002, IRG-003, IRG-022, IRG-023, IRG-820, CY-2, CY-4, CY-9 and CY-20 (all available from NIPPON KAYAKU CO., LTD.), (2) PA-001, PA-1005, PA-1006, SIR-114, SIR-128, SIR-130 and SIR-159 (all available from MITSUI TOATSU CHEMICALS, INC.), (3) IRF-700, IFR-770, IRF-800, IRF-905 and IRF-1170 (all available from Fuji Photo Film Co., Ltd.), (4) EX COLOR 802K and EX COLOR 803K (both available from NIPPON SHOKUBAI CO., LTD.), and the like.

The amount of the dye type near-infrared absorber to be contained in a resin plate can be adequately adjusted. For example, when an acrylic resin plate having a thickness of 3 mm is prepared, the dye type near-infrared absorber is contained in an amount of 0.0001 to 0.2 part by weight, preferably 0.001 to 0.1 part by weight, per 100 parts by weight of an acrylic resin.

A resin plate containing the dye type near-infrared absorber according to the present invention may be prepared by one of the following methods:

(1) A method of melting and kneading a dye type near-infrared absorber in a transparent resin and then molding the resulting mixture;

(2) A method of dissolving or dispersing a dye type near-infrared absorber in a monomer component which is the raw material of a transparent resin, and then polymerizing the monomer;

(3) A method of forming a resin layer containing a dye type near-infrared absorber on the surface of a transparent resin sheet or film by a coating method or the like;

(4) A method of pasting or placing a sheet or film containing a dye type near-infrared absorber, which is prepared by one of the methods (1), (2) and (3), on a transparent resin sheet.

When the method (1), in which a dye type near-infrared absorber is melted and kneaded in a transparent resin and then the mixture is molded, is adopted, the dye type near-infrared absorber is added to the resin in the course of the molding of the transparent resin at a temperature suitable for the utilized transparent resin by a conventional method such as extrusion molding, injection molding or press molding, and thus a transparent substrate containing the dye type near-infrared absorber is prepared.

When the method (2), in which a dye type near-infrared absorber is dissolved or dispersed in a monomer component which is the raw material of a transparent resin and then the monomer is polymerized, is adopted, the dye type near-infrared absorber is dissolved or dispersed in the monomer component as the raw material of the transparent resin, or a syrup containing the monomer and its polymer, and then the mixture is bulk polymerized and hardened, for example, in a cell or a mold to shape it in a desired form. Thus, a transparent substrate containing a dye type near-infrared absorber is obtained.

When the method (3), in which a resin layer containing a dye type near-infrared absorber is formed on the surface of a transparent resin sheet or film by a coating method or the like, is adopted, a solution dissolving the transparent resin and the dye type near-infrared absorber in a suitable solvent is applied on the surface of the transparent resin sheet or film, and the solvent is evaporated off to obtain a transparent substrate containing a dye type near-infrared absorber.

When the method (4), in which a sheet or film containing a dye type near-infrared absorber that is prepared by one of the methods (1), (2) and (3) is pasted or placed on a transparent resin sheet, is adopted, the sheet or film containing the dye type near-infrared absorber prepared by one of the methods (1), (2) and (3) is pasted with a suitable adhesive, or melted and placed by pressing or the like, on a transparent resin sheet containing no dye type near-infrared absorber.

A transparent resin plate used in the present invention may have a hard coat layer on its surface. The kind of the hard coat layer is not limited. For example, a UV ray-cured or thermally cured material of a hard coating agent such as acrylic resins, urethane resin, etc. may be used.

A front panel for a plasma display panel according to the present invention comprises a conductive mesh placed on a transparent resin plate. Examples of such a conductive mesh include metal meshes of copper, stainless steel, iron, etc.; metal meshes plated with nickel, chromium, etc.; synthetic fiber meshes made of synthetic resin filaments which of the surfaces are plated with nickel, copper, etc.; and the like. The kinds of the synthetic fiber in the synthetic fiber meshes are not limited. Polyester fiber is preferred from the viewpoint of strength, durability, and the easiness of etching treatment, which is a pre-treatment prior to plating.

The fiber diameter of a conductive mesh used in the present invention is usually from 10 to 60 $\mu$m. When a mesh is too coarse, the effects of shielding electromagnetic waves decrease. When a mesh is too fine, the visibility of images on displays deteriorates. Thus, a mesh size (expressed by the number of mesh cells per one (1) inch) is usually in a range between 40 and 300, preferably in a range between 60 to 200. The thickness of the mesh is usually in a range between 20 and 200 $\mu$m, preferably in a range between 50 and 100 $\mu$m.

A conductive mesh which of the surfaces are treated in a black or dark color with conductive paints, plating, dyes or pigments, is preferable, since such a mesh effectively functions to suppress the flicker or glare of images or pictures.

In the present invention, a part of a conductive mesh is exposed on a transparent plate in a sheet form on at least one side of the marginal surface of the plate. The grounding from such an exposed part of a conductive mesh can effectively shield electromagnetic waves. Since the front panel having such an exposed part of a conductive mesh can be surely grounded, it can be possible to suppress the deterioration of electromagnetic wave-shielding properties caused by the insufficient connection of a ground wire due to the swing of the ground wire. Accordingly, stable electromagnetic wave-shielding properties can be maintained for a long time.

When a front panel having two transparent resin plates and a conductive mesh placed between the plates is desired, for example, a transparent resin plate having a smaller area than that of a conductive mesh is placed on the conductive mesh to expose a part of the conductive mesh on the plane of the front panel. In this case, the area of the other one of the transparent resin plates may be the same as or larger than that of the conductive mesh. Alternatively, one of the transparent resin plates may be placed on the conductive mesh with shifting its position from that of the conductive mesh.

A part of a conductive mesh may be exposed on one marginal surface side of a front panel, or on two or more marginal surface sides of a front panel. Preferably, a conductive mesh is exposed on all of the four marginal surface sides of a front panel. The exposed part of the conductive mesh may be present on the viewing side of the surfaces of the front panel, or on the opposite side facing a PDP.

The front panel of the present invention can be easily produced by arranging one transparent resin plate, a conductive mesh and another transparent resin plate in this order, and heating and pressing them together. A heating temperature is usually about 110 to 180° C., and a pressing pressure is usually about 10 to 60 kg/cm$^2$.

A soft transparent thermoplastic film as an adhesive film may be interposed between a transparent resin plate and a conductive mesh, or between a transparent resin plate and other transparent resin plate which may be additionally placed, and then they are heated and pressed together, to improve the adhesion between them, or to suppress the deterioration or deformation of the conductive mesh such as expansion of mesh cells of the conductive mesh when they are united by heating and pressing, which may cause the decrease of electromagnetic wave-shielding effects. To attain an effect of improving the adhesion between a transparent resin plate and a conductive mesh, a transparent resin plate, a conductive mesh and an adhesive film may be arranged in this order and processed, while a transparent resin plate, an adhesive film and a conductive mesh may be arranged in this order and processed. Alternatively, a transparent resin plate, an adhesive film, a conductive mesh and another adhesive film may be arranged in this order and processed. As the soft transparent thermoplastic film (adhesive film), used is a highly transparent resin film having a low softening point. The film may have a Vicat softening point of usually about 40 to 100° C., preferably about 50 to 80° C., when measured based on JIS K 7206. Examples of such a resin film include acrylic resin films, vinyl chloride resin films, etc. The thickness of the film is usually about 10 to 200 $\mu$m, preferably about 20 to 100 $\mu$m.

A front panel for a plasma display panel according to the present invention comprises a transparent resin plate and a conductive mesh placed on the transparent resin plate, while it may optionally comprise an antireflection layer, a stainproof layer, a hard coat layer, etc., if desired. Such an antireflection layer, a stainproof layer or a hard coat layer may be placed at any position in a front panel for a plasma display panel according to the present invention.

An antireflection layer is provided to improve visibility. The antireflection layer may comprise a multi-layered antireflection film comprising a layer of a low refractive index material (e.g. magnesium fluoride, silicon oxide, etc.) and a layer of a high refractive index material (e.g. titanium oxide, tantalum oxide, tin oxide, indium oxide, zirconium oxide, zinc oxide, etc.) in combination; a single-layered antireflection film mainly comprising a low refractive index material; and the above films additionally having an adhesive layer or a surface-modifying layer which improves adhesion or hardness of the films. A three-layered antireflection layer consisting of an aluminum oxide layer, a magnesium fluoride layer and a silicon oxide layer is preferable from the viewpoint of endurance to temperature change caused by a heat from a display screen. Furthermore, a multi-layered film comprising an indium oxide-tin oxide (ITO) layer and a silicon oxide layer, or a multi-layered film comprising a silicon oxide layer and a titanium oxide layer is preferable from the viewpoint of antireflection effects, surface hardness, cohesiveness and costs thereof. In particular, the multi-layered film comprising a silicon oxide layer and a titanium oxide layer is preferable since it has excellent transparency.

Such an antireflection layer may be placed directly on the surface of a transparent resin plate by any known method such as coating, vacuum deposition, spattering, ion plating, etc., or it may be placed by laminating or adhering a transparent film carring an antireflection film on the surface thereof, to a transparent resin plate. The antireflection layer may be placed on one or both of the surfaces of the front panel of the present invention. Preferably, the antireflection layer is formed on the both surfaces of the front panel.

When the antireflection layer is formed, its surface is easily stained with soils, fingerprints, spots of cosmetics, etc and, therefore, a stainproof layer may be formed on the antireflection layer to prevent staining or to facilitate the removal of stains if the surface is stained.

The stainproof layer is not particularly limited and any of the known conventional stainproof layers may be used. Examples of stainproof layers include stainproof layers comprising a fluorine atom and a siloxane, which are disclosed in JP-A-3-266801, JP-B-6-29332, JP-A-6-256756, JP-A-1-294709 (U.S. Pat. No. 5,081,192), etc. Such a stainproof layer may be formed directly on the surface of a transparent resin plate, or it may be formed by laminating or adhering a transparent film carrying a stainproof layer on the surface thereof, to a transparent resin plate. The stainproof layer may be formed on one or both of the surfaces of the front panel of the present invention.

A hard coat layer is formed to enhance the hardness of a front panel. Any conventional hard coat layer may be used in the present invention. For example, a hard coat layer obtained by polymerizing and curing a coating agent mainly comprising a polyfunctional monomer can be used.

Examples of the hard coat layers include layers obtained by polymerizing and curing polyfunctional polymerizable compounds having two or more acryloyl groups or methacryloyl groups (e.g. urethane(meth)acrylate, polyester (meth)acrylate, polyether(meth)acrylate, etc.) with activation energy rays such as UV rays, electron beams, etc.; and layers obtained by thermally crosslinking and curing silicone type-, melamine type- or epoxy type-crosslinkable resin raw materials. Among them, a layer obtained by polymerizing and curing a urethane acrylate polyfunctional polymerizable compound, and a layer obtained by crosslinking and curing a silicone type-crosslinkable resin raw material are preferable from the viewpoint of durability and the easiness of handling.

To obtain a hard coat layer, for example, a coating agent comprising the above compound is applied by a general method employed in coating processes, for example, spin coating, dip coating, roll coating, gravure coating, curtain flow coating, bar coating, etc., and then cured. In such a case, the coating agent may be diluted with a solvent of various types and then applied, in order to attain easy coating or to adjust the thickness of the coating layer. The applied coating agent can be cured by thermal polymerization with heating, or photopolymerization with the irradiation of activation energy rays such as UV-rays, electron beams, etc.

The thickness of the hard coat layer is not limited, and is preferably from 1 to 20 $\mu$m. When the thickness is less than 1 $\mu$m, optical interference fringes appear due to the influence of an upper anti-reflection layer, so that the resulting front panel tends to have unpreferred appearance. When the thickness exceeds 20 $\mu$m, the strength of the layer tends to decrease unpreferably, and thus the coated layer may be cracked.

The adhesive film, which is described above, maybe provided between a hard coat layer and a transparent resin plate or the like to improve the adhesion between them.

The hard coat layer may be placed directly on the surface of a transparent resin plate, or it may be placed by laminating or adhering a transparent film carrying a hard coat layer on the surface thereof, to a transparent resin plate. The hard coat layer may be placed on one or both of the surfaces of the front panel of the present invention.

Preferably, uneven patterns are formed on at least one side of surfaces of a front panel for a plasma display panel according to the present invention. The uneven patterns are usually formed on a side of the surfaces of a front panel facing a PDP, although they may be formed on the other side of surfaces of a front panel facing a viewer, or both sides of surfaces thereof.

The uneven patterns may be formed directly on a transparent resin plate, or on an already placed hard coat layer on the plate. The latter case is preferred, since the mechanical strength, abrasion resistance and the like of the uneven patterns are improved. In another preferred embodiment, the uneven patterns are formed on one side of surfaces of a front panel, while a hard coat layer is placed on the other side of surfaces of the panel.

The uneven patterns may be formed by transferring such patterns from an embossing master, or by applying a coating containing inorganic compound particles (e.g. silicon dioxide such as silica gel, aluminum oxide, magnesium oxide, tin oxide, zirconium oxide, titanium oxide etc.) and drying it. The formation of uneven patterns by transferring from an embossing master is simple and achieves a high yield, since the uneven patterns can be formed using embossing master in the heating and pressing step of the production process of a front panel.

Examples of such an embossing master include molds used in heating and pressing steps, films having uneven patterns thereon, etc. When a mold is used, it is preferred that a releasing agent is previously applied to the transfer surface of the mold. Films having uneven patterns are preferably used, since produced front panels can be easily removed after heating and pressing, and the handling of the films is easy.

Any film may be used insofar as it can be resistant to heating and pressing. Examples of such films are polyethylene terephthalate (PET) films, triacetylcellulose (TAC) films, etc. Among them, PET films are preferable from the viewpoint of costs. The thickness of the film is not limited, and usually at least 20 μm from the viewpoint of the easiness of handing, and no larger than 500 μm from the viewpoint of costs, and preferably from 30 to 300 μm.

The surface of the above film carries formed uneven patterns which correspond to the uneven patterns of a front panel. The uneven patterns may be formed on a film by embossing, or dispersing fillers in the film. The formation of uneven patterns by embossing is preferable from the viewpoint of the durability of the film.

To form uneven patterns on the surface of a front panel using such a film, for example, a transparent resin plate or the like may be put on a film carrying uneven patterns with allowing the side of the surfaces of the transparent resin plate or the like, on which uneven patterns are formed afterwards, in contact with the uneven pattern of the film, and then heated and pressed as explained above. Thereafter, the film is removed to obtain a front panel having uneven patterns on its surface. The removed film may be recovered and recycled.

The above uneven patterns preferably has Average Spacing of Roughness peaks in a range between 3 and 500 μm, and Ten point height of irregularities in a range between 1 and 20 μm. which are measured based on JIS B 0601. Here, Average Spacing of Roughness peaks means an arithmetic mean value of Averaged Line lengths from one projection (convex) to an adjacent depression (concave) thereto along a standard length. Ten-point height of irregularities means the sum of the averaged value of absolute altitudes of the peaks of the highest projection to the fifth highest projections, and the averaged value of absolute altitudes of the bottoms of the deepest depression to the fifth deepest depression.

In the present invention, a conductive mesh is preferably present in a depth of 0.5 mm or less from either one side of surfaces of a front panel, since the warp of the front panel can be suppressed.

A front panel for a plasma display panel according to the present invention preferably has a surface resistivity of $10^{11}$ Ω/square or less from the viewpoint of the suppression of dust accumulation.

Such a surface resistivity may be attained by a method comprising the steps of applying a nonionic, anionic or cationic surfactant to the surface of a front panel and drying it; a method comprising the step of applying a coating which comprises a conductive filler mainly containing a metal oxide such as tin oxide, indium oxide, antimony oxide, etc. on the surface of a front panel; a method comprising the step of placing an ITO (indium oxide-tin oxide) film on the surface of a front panel by a vacuum process such as spattering, vapor deposition, etc.; a method comprising the step of placing a conductive polymer such as polythiophene, polypyrrole, polyacetylene, etc. on the surface of a front panel; and the like.

When a decorative portion is provided in a front panel for a plasma display panel according to the present invention, which comprises a transparent resin plate and a conductive mesh placed on the transparent resin plate, it is preferred that an intermediate synthetic resin plate is placed between the conductive mesh and the transparent resin plate, and the decorative portion is provided between the intermediate resin plate and the transparent plate to maintain the clearness of colors of the decorative portion and achieve attractive appearance of the decorative portion.

Such an intermediate resin plate may be the same as a transparent resin plate which is described above. Alternatively, a plurality of transparent plates, for example, "a synthetic resin plate for a display side", "an intermediate synthetic resin plate" and "a synthetic resin plate for a viewer side" (all of which are the same as transparent resin plates which are mentioned above), can be used. In this case, the synthetic resin plate for the viewer side, the intermediate synthetic resin plate, a conductive mesh and the synthetic resin plate for the display side can be placed in this order.

It is noted that the synthetic resin plate for a display side, the intermediate synthetic resin plate and the synthetic resin plate for a viewer side may be the same or different kind of resin plates, and the resin plates can be selected in accordance with the objects thereof. For example, the resin plates having a relatively low transmission of visible light such as transparent resin plates having near-infrared ray-shielding properties, colored transparent resin plates, etc. are preferably used as the intermediate synthetic resin plates or the synthetic resin plates for a display side.

When a decorative portion is provided, a part of a conductive mesh maybe exposed on a viewer side of a front panel or on a display side of a front panel, and such an exposed part of the mesh can be easily covered up with the decorative portion.

There is no limitation on a method for providing a decorative portion. For example, a decoration member such as a transparent resin plate carrying a decoration may be used. Such a decorative portion is preferably provided by printing a decoration on the surface(s) of an intermediate synthetic resin plate and/or a synthetic resin plate for a viewer side, from the viewpoint of mass productively. Alternatively, an additional transparent resin plate on which a decoration is formed by printing is also preferably utilized. The colors of a decorative part are not limited. For example, the background of a decorative part is colored black, while characters such as logos are written with a white color, to provide a display screen with firm impression. Examples of paints used to form a decorative portion by printing include acrylic paints, urethane paints, epoxy paint, etc. For example, when a decorative portion is printed on an acrylic resin plate as a transparent resin plate, acrylic paints are preferably used, since the sufficient adhesion of the decorative portion to the transparent resin plate can be attained.

A decorative portion may be formed on either one or both of an intermediate synthetic resin plate and a synthetic resin plate for a viewer side. Furthermore, other transparent resin plate may be placed on the display-side surface of a synthetic resin plate for a display side, or the viewer-side surface of a synthetic resin plate for a viewer side.

It is preferable to form uneven patterns on at least one side of surfaces of a front panel for a plasma display panel according to the present invention by the same methods as described above, even when a decorative portion is provided to the front panel. Such uneven patterns can prevent the reflection of exterior light in the case that they are formed on a viewer-side surface of the front panel, while a Newton's ring is seldom generated if they are in contact with a display screen in the case they are formed on a display-side surface of the front panel. Therefore, both cases are preferred.

Methods for producing a front panel having a decorative portion may be the same as those described above. For example, such a front panel can be easily produced by arranging a synthetic resin plate for a viewer side, an intermediate synthetic resin plate and a conductive mesh in this order, and heating and pressing them together. When a synthetic resin plate for a display side is further placed, a synthetic resin plate for a viewer side, an intermediate synthetic resin plate, a conductive mesh and a synthetic resin plate for a display side are arranged in this order, and then heated and pressed them in the same way as described above.

A decorative portion may be provided by printing on a synthetic resin plate for a viewer side and/or an intermediate synthetic resin plate, or by interposing other synthetic resin plate having a decoration applied thereon by printing etc., between an intermediate synthetic resin plate and a synthetic resin plate for a viewer side and then heating and pressing them together.

Figure 4D:
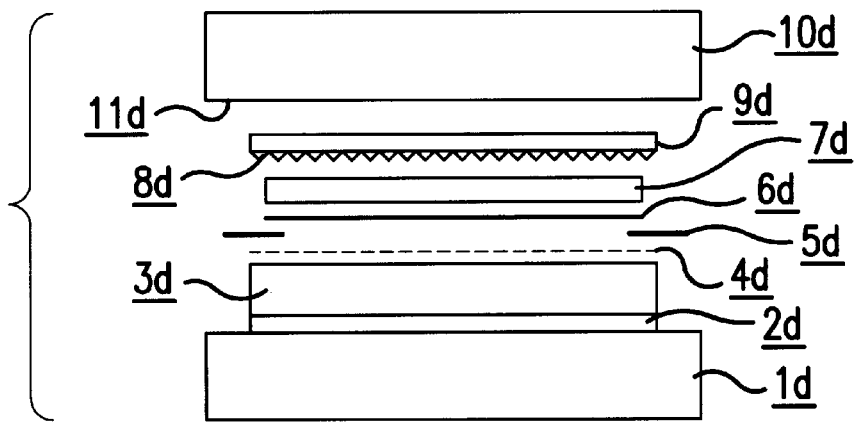
FIG. 4-*b* is a cross sectional view showing the layer structure of a front panel for a plasma display panel produced in Example 2-b.
Figure 4B:
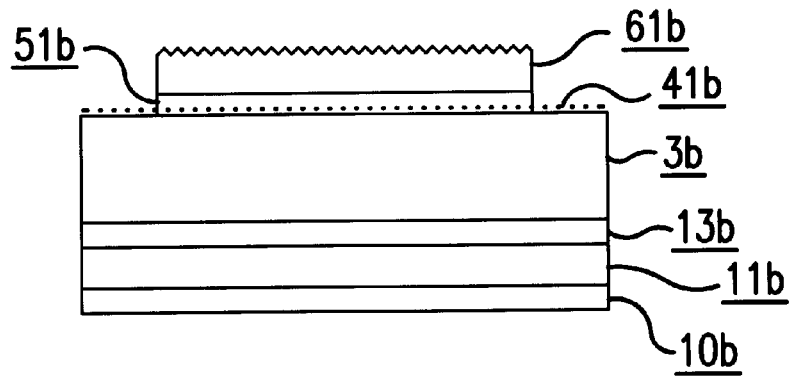
Figure 4C:
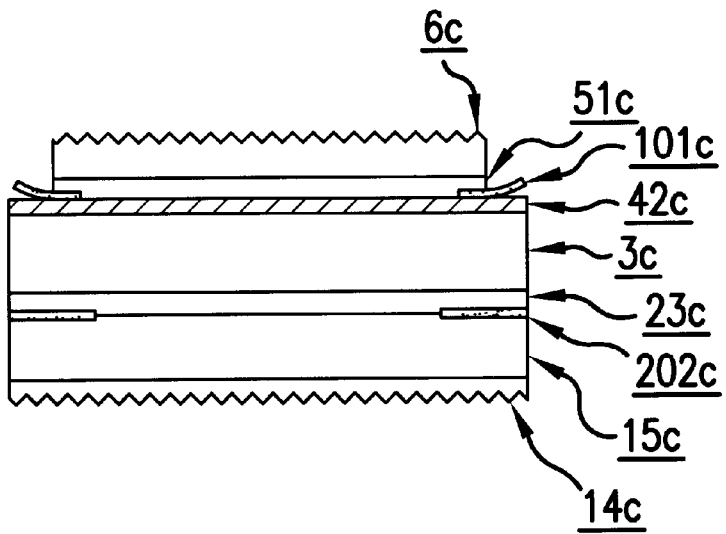

When a conductive film is further provided, for example, as shown in FIG. 4-c, an intermediate synthetic resin plate, a conductive mesh, a conductive film and a synthetic resin plate for a display side are arranged in this order, and then heated and pressed. In such a case, the conductive film can be easily covered up with the above decorative portion.

An adhesive film may be interposed between an intermediate synthetic resin plate and a synthetic resin plate for a display side and then heated and pressed, to improve the adhesion, for example, between these resin plats and between a conductive mesh and a conductive layer, and to bond them more firmly. The adhesive film may be the same as one described above.

When a front panel for a plasma display panel according to the present invention is used, a conductive mesh is usually maintained at a ground potential level. To this end, the conductive mesh is preferably in contact with the ground potential part of a display, etc. In general, such a ground potential level can be maintained by allowing the exposed part of a conductive mesh in contact with the ground potential level of a display.

It may be possible to maintain a conductive mesh at a ground potential by setting a conductive film so as to electrically contact with the conductive mesh and allowing the conductive film in contact with the ground potential part of a display. In this case, the conductive mesh and the conductive film are placed and laminated between two transparent resin plates.

A conductive film is usually made of a material having good electrical conductivity. Preferred examples of a conductive film include metal films of copper, aluminum, silver, alloys of two or more of such metals, stainless steel, etc.

The thickness of the conductive film is usually from 0.5 to 500 $\mu$m, preferably from 1 to 200 $\mu$m, from the viewpoint of mechanical strength and easy processing.

When a conductive film is provided, it should be in contact with a conductive mesh. Thus, as described above, the conductive film and the conductive mesh are usually arranged so that they overlap each other and are in contact with each other. Insofar as they overlap each other, their positional relationship is not limited. The conductive film may be in contact with either side of surfaces of the conductive mesh.

In a front panel for a plasma display panel according to the present invention, a conductive mesh and a conductive film are preferably arranged so that they are in contact with each other in a sheet form on the exposed part of the conductive mesh which is on the marginal surface of the front panel. In this case, the conductive film can be provided only on one marginal side of the front panel, or on two or more marginal sides of the front panel. The conductive film is preferably provided on four marginal sides of the front panel from the viewpoint of electromagnetic wave-shielding properties.

The width of the overlapped areas of a conductive film and a conductive mesh is usually at least 1 mm, preferably from about 2 to 50 mm, from the viewpoint of electromagnetic wave-shielding properties and durability.

When a conductive mesh is placed between two transparent resin plates, a conductive film to be used preferably has holes, since the conductive mesh can be bonded firmly between two transparent resin plates.

It is preferred that the holes are substantially uniformly scattered almost over the whole area of a conductive film. The area of each hole is usually 100 mm$^2$ or less, preferably 0.1 to 50 mm$^2$, and the total area of holes is usually 0.1 to 50%, preferably 0.5 to 40%, of the whole area of the conductive film.

A conductive film carrying an adhesive on one side of its surfaces is preferably used to firmly fix the conductive film and a transparent resin plate. The kind of the adhesive is not limited. Adhesives having thermoplastic properties are preferably used, since wide-range press conditions can be employed when they are used.

When a conductive film is further provided, it is preferred that a part of the film is exposed from a front panel and is connected to a grounding wire or a grounding electrode. In this case, a conductive mesh can be easily maintained at a ground potential.

Figure 3D:
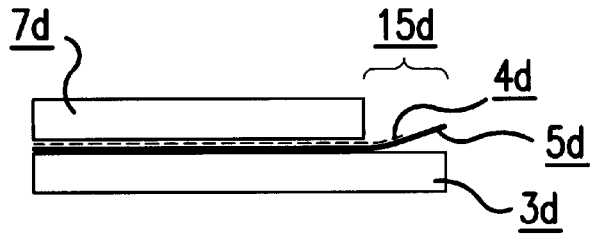
FIG. 3-*b* shows a layer arrangement in the course of heat press processing in Example 2-b.
Figure 3B:
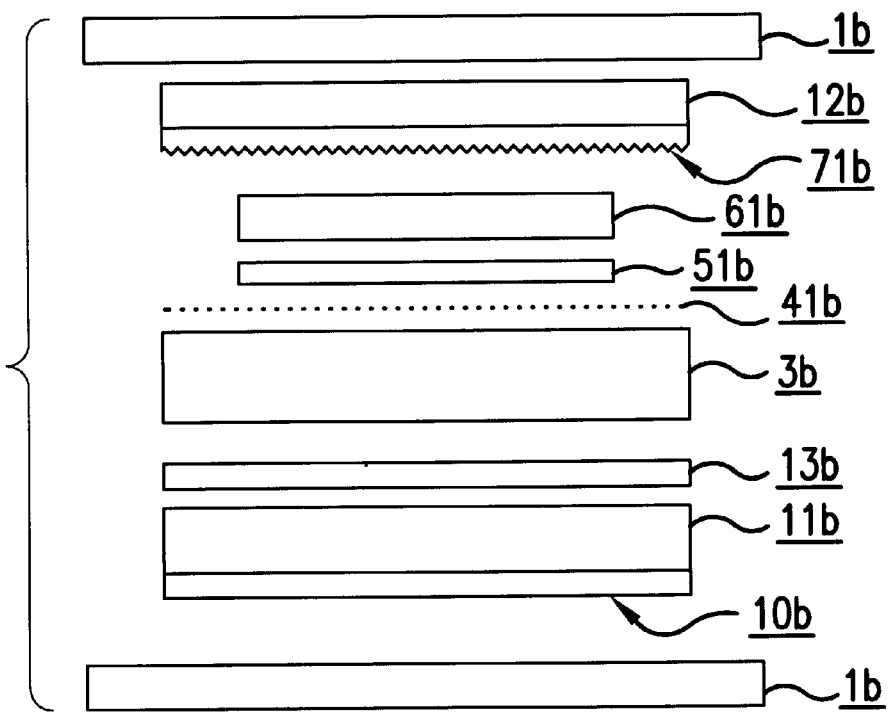
Figure 3C:
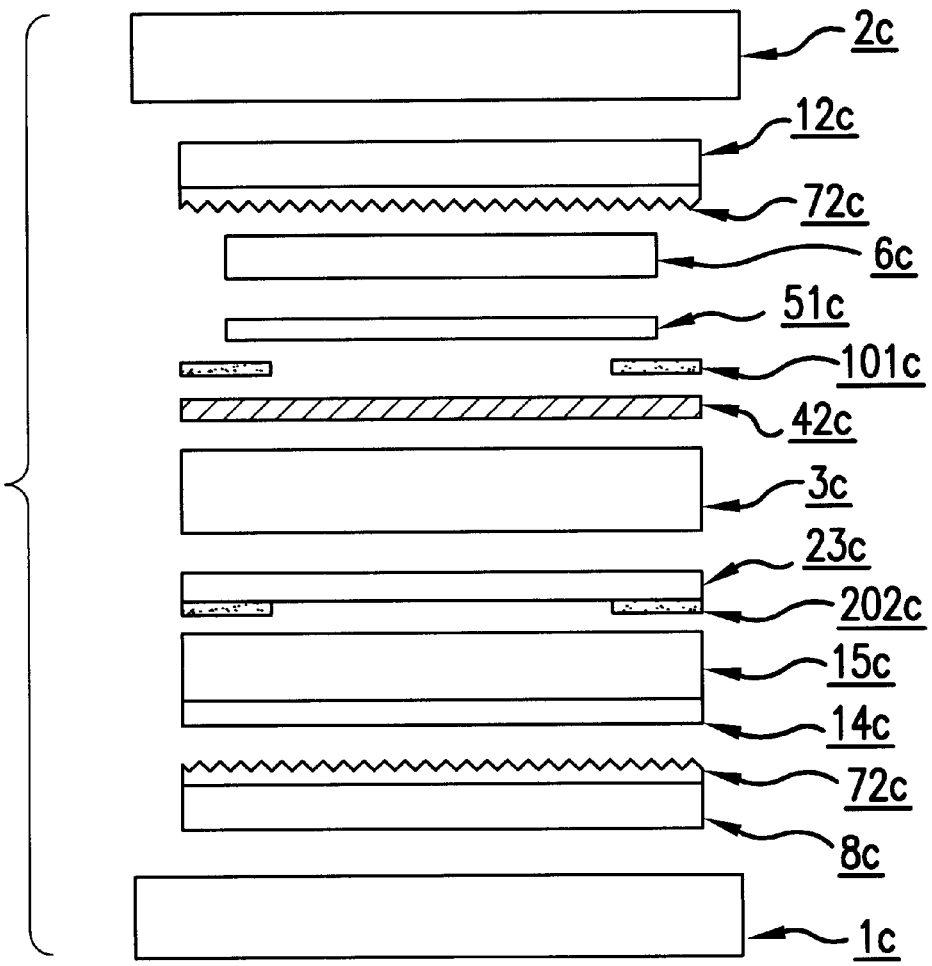

The exposed part of a conductive film can be provided by protruding the edge of the conductive film beyond a transparent resin plate along one side of a front panel as shown in FIG. 1-d, or by protruding the end(s) of the conductive film beyond side(s) of a transparent resin plate which are perpendicular to a side along which the conductive film is provided as shown in FIG. 2-d, although it can also be provided by cutting out a part of a transparent resin plate. Furthermore, as shown in FIG. 3-d, a conductive film can be exposed on the plate on one side of surfaces of the front panel. This embodiment is preferable since the exposed part can be easily provided.

These exposed parts can be provided by suitably selecting the sizes, arrangement and shapes of synthetic resin plates and a conductive film. (In FIGS. 1-d, 2-d and 3-d, constituent parts other than a conductive film and a transparent resin plate are omitted to simply show the relationship of the exposed part of the conductive film and the shape of the front panel.)

Figure 5D:
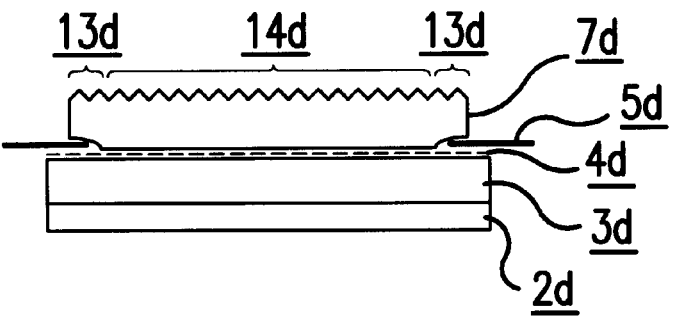
FIG. 5-*b* shows a layer arrangement in the course of heat ok press processing in Example 3-b.
Figure 9B:
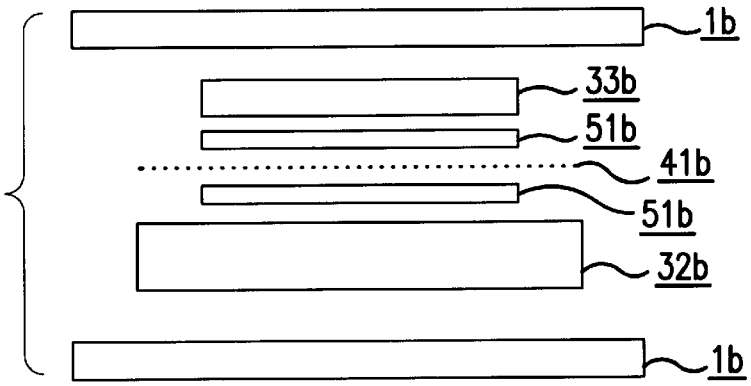
FIG. 9-*b* shows a layer arrangement in the course of heat press processing in Example 5-b.
Figure 9D:
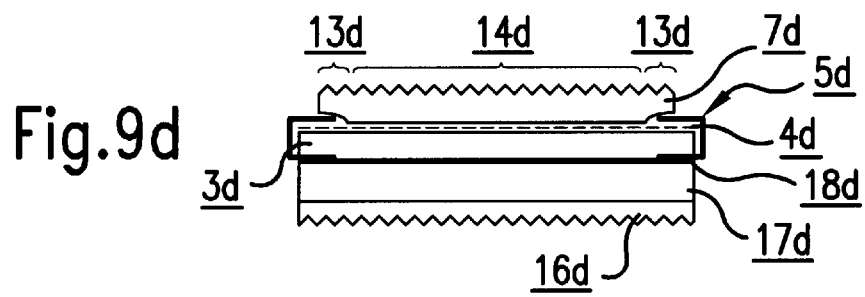

As described above, when a conductive film has an exposed part, the exposed part may be present on either the viewer-side surface or the display-side surface of a front panel. In addition, concerning an exposed part, only a conductive film may be exposed as shown in FIG. 5-d, or a conductive film and a conductive mesh may be both exposed on the plate in the same side of surfaces of the front panel with the conductive film and conductive mesh being in contact with each other in the exposed part. Furthermore, the exposed part may be overlain on one surface of a front panel, or the edges of the exposed parts may be folded back in a gap between transparent resin plates, when a plurality of transparent resin plates are utilized, as shown in FIG. 9-d.

A front panel for a plasma display panel according to the present invention can be produced as described above. Such a front panel may be trimmed, for example, its marginal parts may be cut off, so that its size is matched to a desired size. In this case, it is preferable to trim a front panel to a desired size without cutting off the exposed parts of a conductive mesh and a conductive film.

A metal thin film of, for example, silver, copper, gold, chromium, stainless steel, nickel, etc. may be placed on the surface of a front panel for a plasma display panel according to the present invention, in a thickness which does not interfere the transparency of the front panel, to further improve near-infrared ray-shielding properties.

A front panel for a plasma display panel according to the present invention can be surely grounded, and thus more stably exhibits electromagnetic wave-shielding properties than conventional front panels. In addition, the front panel of the present invention has good visibility by optionally possessing uneven patterns on its surface, and anti-reflection properties, anti-abrasion properties, and stain-proof properties. The use of a transparent resin plate having near-infrared ray-shielding properties can provide a front panel which can effectively shield near-infrared rays.

The present invention can provide a front panel for a plasma display panel which is less warped and generates less Newton's ring, a front panel for a plasma display panel which maintains the clearness of colors of a decorative portion, and a front panel for a plasma display panel which has good durability and stability of grounding.

EXAMPLES

The present invention will be illustrated by the following Examples, which do not limit the scope of the present invention in any way.

Properties were measured and evaluated as follows:
1) Total Light Transmittance in Visible Light Range A total light transmittance in the visible light range was measured with a haze computer Type HGM-2DP (manufactured by SUGA SHIKENKI).

2) Light Transmittance in a Wavelength Range Between 800 and 1000 nm

A light transmittance in a wavelength range between 800 and 1000 nm was measured with an autographic spectrophotometer Type 330 (manufactured by Hitachi Limited).
3) Visibility An obtained front panel for a plasma display panel was attached to the screen of a plasma display panel. Then, by observing the screen thereof with an eye, the difference of colors and contours of images before and after the attachment of the front panel was evaluated.
4) Electromagnetic Wave-shielding Properties The intensity of electromagnetic waves was measured with a shielding material-evaluation system R2547 (manufactured by ADVANTEST CORPORATION). Then, the electromagnetic wave-shielding ability of an obtained front panel for a plasma display panel was calculated based on the following equation: Electromagnetic wave-shielding ability (dB)=20 $Log_{10}(X_0/X)$ in which $X_0$ is the intensity of electromagnetic waves without a front panel for a plasma display panel, and X is the intensity of electromagnetic waves with a front panel for a plasma display panel.

The larger value of an electromagnetic wave-shielding ability means that the obtained front panel for a plasma display panel has higher electromagnetic wave-shielding properties.

In the evaluation using the above system, the number of handle turns corresponds to a pressure required to constrict and fix a front panel for a plasma display panel (a degree of fixing). The smaller number of handle turns corresponds to severe conditions for a front panel to exhibit shielding properties.
5) Remote Controlling Test An obtained front panel for a plasma display panel was set in front of a photodetection part for the remote controlling of a domestic TV set. Then, a signal in a near-infrared range (a signal wavelength of 950 nm) was transmitted by a remote controller from a distance of 3 m, and the response of the TV set was checked. If the TV set does not respond to the signal in this test, the installed front panel can prevent problems caused by near-infrared rays which are generated by display devices such as plasma display panels, etc.
6) Warp A distance (A: cm) between the diagonal line and the central part of a front panel was measured on a side having a concave plane at the central part of the front panel. Then, a warp (D: cm) was calculated from the distance A and the area (S: $cm^2$) of the front panel based on the following equation:

$$D = A \times (1/S)^{1/2}$$

Example 1-a

A polyester gauze (gossamer) fabric having a size of 200×200 mm, a thickness of 60 μm, and a weaving density of 140 mesh/inch, the filament surfaces of which had been plated with copper and nickel and then dyed black, (manufactured by KABUSHIKIKAISHA SEIREN) was used as the conductive mesh 2a, an acrylic plate having a size of 200×200 mm and a thickness of 4 mm (SUMIPEX 000 manufactured by Sumitomo Chemical Co., Ltd.) was used as the transparent resin plate 1a, and the soft acrylic film 3a having a size of 160×160 mm and a thickness of 20 μm (SUNDUREN SD 003 manufactured by KANEKA CORPORATION) was used. They were arranged as shown in FIG. 1-a.

A pair of stainless steel protection plates each having a size of 300×300 mm and a thickness of 2 mm, the surfaces facing the acrylic resin plate 1a and the acrylic film 3a being mirror finished, were arranged over and below the above arranged members, and all the members were installed in a 50 ton hydraulic press as they were. Then, the members were heated and pressed at a press temperature of 140° C. under a press pressure of 40 kg/cm² for 10 minutes to place and integrate them.

After cooling, the stainless steel protection plates were detached to obtain a front panel, in which the conductive mesh 2a made of the polyester gauze fabric was embedded in the central area (160×160 mm) of the acrylic resin plate 1a, while the margin of the conductive mesh 2a having a width of 20 mm was not embedded.

This front panel was attached to a plasma display panel, and the screen was observed. The visibility was good.

Since a part of the conductive mesh 2a (polyester gauze fabric) were exposed in a sheet form on the marginal surface of the front panel, it was possible to ground the panel from the exposed mesh part as it was.

The electromagnetic wave-shielding ability of this front panel was evaluated by measuring the change of the electromagnetic wave-shielding ability corresponding to the number of turns of the sample-fixing handle in the above shielding material-evaluation system. The results are shown in Table 1. It is noted that the handle was completely fastened at three turns.

This front panel had very stable and good electromagnetic wave-shielding properties.

Example 2-a

Benzoic anhydride (5 parts by weight) and tert.-butyl peroxy-2-ethylhexanoate (1 part by weight) as a radical polymerization initiator were dissolved in a monomer mixture (100 parts by weight) containing methyl methacrylate (90% by weight) and $CH_2=C(CH_3)COO[CH_2CH(CH_3)O]_{5.5}-P(O)-(OH)_2$ as a phosphorous atom containing monomer (10% by weight).

The solution was poured in a polymerization cell comprising a pair of glass plates each having a size of 220 mm×220 mm and a thickness of 10 mm and a gasket made of polyvinyl chloride, and thermally polymerized at 55° C. for 12 hours and then at 100° C. for 2 hours. Thus, a transparent resin plate having a size of 200 mm×200 mm and a thickness of 3 mm was obtained.

This transparent resin plate had a total light transmittance of 85%, and a light transmittance of not more than 12% in the wavelength range between 800 nm and 1000 nm.

Then, a front panel, in which a polyester gauze was embedded in the central area of a resin plate while the margin of the gauze was not embedded, was produced in the same manner as in Example 1 except that the above-produced transparent resin plate was used.

This front panel was attached to a plasma display panel, and the screen was observed. The visibility was good.

This front panel was completely grounded like the front panel of Example 1-a. In addition, the TV set did not respond in the remote controlling test.

Comparative Example 1-a

The polyester gauze (gossamer) fabric 5a having a size of 230×230 mm, a thickness of 60 μm, and a weaving density of 140 mesh/inch, the filament surfaces of which had been plated with copper and nickel and then dyed black, (manufactured by KABUSHIKIKAISHA SEIREN), the acrylic plates 4a each having a size of 250×250 mm and a thickness of 2 mm (SUMIPEX 000 manufactured by Sumitomo Chemical Co., Ltd.), and the soft acrylic films 6a each having a size of 250×250 mm and a thickness of 20 μm (SANJUREN SD 003 manufactured by KANEKA CORPORATION) were arranged as shown in FIG. 2-a.

A pair of stainless steel protection plates each having a size of 300×300 mm and a thickness of 2 mm, the surfaces facing the acrylic resin plates 4a being mirror finished, were arranged over and below the above arranged members, and all the members were installed in a 50 ton hydraulic press as they were. Then, the members were heated and pressed at a press temperature of 140° C. under a press pressure of 40 kg/cm² for 10 minutes to place and integrate them.

After cooling, the stainless steel protection plates were detached to obtain a front panel, in which the polyester gauze fabric was completely embedded in the central part of the acrylic resin plates.

The four sides of this front panel were cut so as to expose the polyester gauze fabric on the four side faces (the lateral faces) of the panel, to obtain the front panel having a size of 200 mm×200 mm and a thickness of 4 mm. The conductive part (polyester gauze fabric) appeared on the side faces in a linear form. Thus, it was very difficult to ground it.

The electromagnetic wave-shielding ability of this front panel was evaluated by measuring the change of the electromagnetic wave-shielding ability corresponding to the number of turns of the sample-fixing handle in the above shielding material-evaluation system. The results are shown in Table 1.

This front panel was not sufficiently grounded, and its electromagnetic wave-shielding properties fluctuated greatly depending on the degree of fixing and frequency, and were not stable.

TABLE 1

| Frequency (MHz) | Number of handle turns | Electromagnetic wave-shielding ability (dB) | |
|---|---|---|---|
| | | Example 1 | Comp. Ex. 1 |
| 30 | 0 | 59 | 45 |
| | 1 | 59 | 52 |
| | 2 | 59 | 50 |
| | 3 | 59 | 59 |
| 50 | 0 | 60 | 42 |
| | 1 | 60 | 59 |
| | 2 | 60 | 60 |
| | 3 | 60 | 60 |
| 70 | 0 | 59 | 40 |
| | 1 | 59 | 49 |
| | 2 | 59 | 50 |
| | 3 | 59 | 51 |
| 90 | 0 | 58 | 40 |
| | 1 | 58 | 48 |
| | 2 | 58 | 52 |
| | 3 | 58 | 50 |

Example 1-b

As shown in FIG. 1-b, the acrylic resin MMA plate (hereinafter referred to as "MMA plate") 3b having near-infrared ray-shielding properties was set on the mirror finished press plate 1b made of stainless steel (SUS) (with the mirror surface facing upward) with the hard coat plane 2a facing downward. Then, the conductive mesh 41b, the adhesive acrylic film 51b, the acrylic film 6b, the non-glare polyethylene terephthalate film (hereinafter referred to as "non-glare PET film") 8b (with the non-glare surface 72b facing downward) were arranged in this order. Finally, a mirror finished press plate was set over these members with its mirror finished surface facing downward. Then, the members were heated and pressed at 130° C. under a pressure of 40 kg/cm² for 20 minutes. Thereafter, the non-glare PET film 8b as an embossing master was removed to obtain a front panel, in which the acrylic film 6b had the uneven patterns on its surface transferred from the surface of the non-glare PET film 8b, as shown in FIG. 2-b.

The MMA plate 3b was a cast plate having near-infrared ray-shielding properties and a thickness of 3 mm, the surface thereof having the acrylic hard coat layer 2b. The hard coat layer 2b was a UV-curable type one, and had a thickness of 4 μm.

The acrylic film 6b had a glass transition temperature of 101° C. and a thickness of 125 μm.

The non-glare PET film 8b consisted of a PET substrate having a thickness of 188 μm and a hard coat layer, which of the surface was embossed to form uneven patterns 72b (non-glare surface).

The conductive mesh 41b consisted of polyester fibers (manufactured by TAKASEMETAX Co., Ltd.) which were thinly plated with copper and coated with a conductive black resin to suppress reflection. A mesh size thereof was 100× 100 mesh, and a fiber diameter thereof was 40 μm.

The adhesive acrylic film 51b was a soft acrylic film (SUNDUREN manufactured by KANEKA CORPORATION) having a thickness of 50 μm.

The length and width of the acrylic film 6b and the adhesive acrylic film 51b were each about 20 mm smaller than those of the conductive mesh.

Accordingly, the conductive mesh 41b was exposed in the plane of the front panel on the entire marginal sides of the front panel in a width of about 10 mm, and was embedded in the central part of the front panel to a depth of 140 μm from the surface on the mesh side (, which is a side of surfaces of the panel on which the mesh is exposed).

The warp of this front panel was about 10 mm.

The obtained front panel was attached to the screen of PDP. The mesh side of the front panel faced the PDP, and the exposed mesh having a width of 10 mm on the marginal surface of the front panel was connected to a ground potential level. Thus, good electromagnetic wave-shielding properties were attained. The use of the near-infrared ray shielding plate could sufficiently shield the near-infrared rays emitted by PDP, and thus no malfunction happened in the remote control of electric equipment.

No Newton's ring was generated by the uneven patterns formed on the mesh side of this front panel. Thus, this front panel had good visibility. In addition, the surface opposite to the mesh side surface (hereinafter referred to as "viewer side surface") had practically good surface hardness, and had no scratch in the practical use.

Example 2-b

As shown in FIG. 3-b, on the SUS-made mirror finished press plate 1b, the acrylic film 11b carrying the hard coat layer 10b (with the hard coat layer facing downward), the adhesive acrylic film 13b, the MMA plate 3a having near-infrared ray-shielding properties, the conductive mesh 41b, the adhesive acrylic film 51b, the acrylic film 61b and the non-glare PET film 12b (with the non-glare surface facing downward) were arranged in this order. Finally, another mirror finished press plate was set over these members with its mirror finished surface facing downward. Then, the members were heated and pressed at 130° C. under a pressure of 40 kg/cm² for 20 minutes. Thereafter, the non-glare PET film 12b as a embossing master was removed to obtain a front panel for PDP, in which the acrylic film 61b had the uneven patterns transferred from the surface of the non-glare PET film 12b, as shown in FIG. 4-b.

The acrylic film 61b had a glass transition temperature of 105° C. and a thickness of 250 μm. The non-glare PET film 12b consisted of a PET substrate having a thickness of 188 μm and a hard coat layer having a surface on which non-glare surface was formed by embossing. The acrylic film 11b carrying the hard coat layer 10b consisted of an acrylic film having a thickness of 250 μm to which an acrylic urethane hard coat layer having a thickness of about 4 μm was provided. The conductive mesh 41b, MMA plate 3b and adhesive acrylic film 51b were the same as those used in Example 1-b. Furthermore, the length and width of the acrylic film 61b and the adhesive acrylic film 51b were each about 20 mm smaller than those of the conductive mesh, like in Example 1-b.

Accordingly, the conductive mesh was exposed in the plane of the front panel on the entire marginal sides of the front panel in a width of about 10 mm, and was embedded in the central part of the front panel to a depth of about 260 μm from the surface on the mesh side.

The warp of this front panel was about 15 mm.

The obtained front panel was attached to the screen of PDP in the same way as in Example 1-b. The front panel had as good electromagnetic wave-shielding and near-infrared ray-shielding properties as those of Example 1-b.

No Newton's ring was generated by the uneven patterns formed on the mesh side of this front panel like Example 1-b. In addition, the surface had good surface hardness, and had no scratch in the practical use.

Example 3-b

Figure 6D:
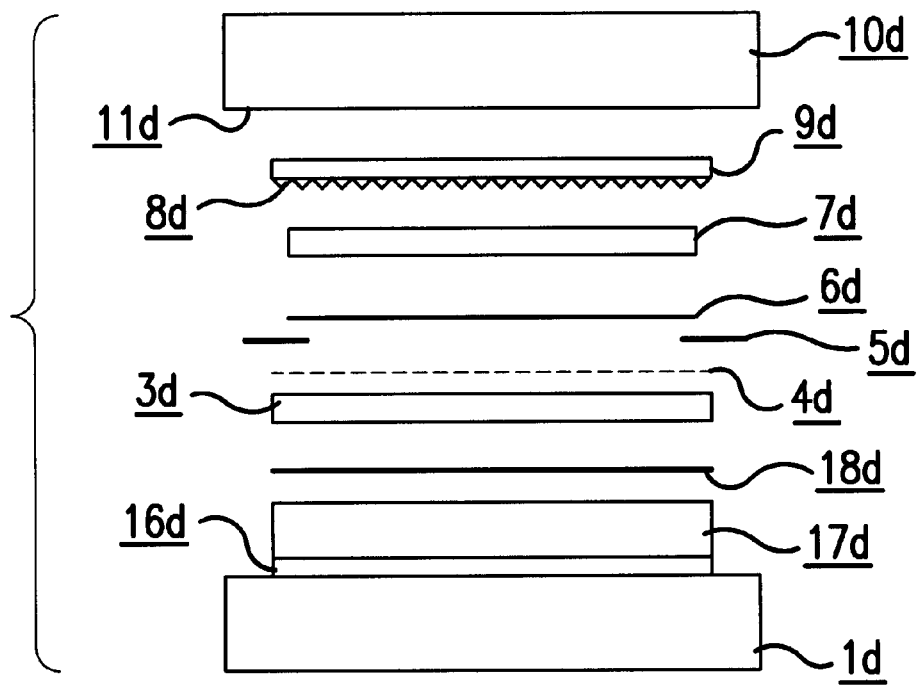
FIG. 6-*b* is a cross sectional view showing the layer structure of a front panel for a plasma display panel produced in Example 3-b.

As shown in FIG. 5-b, on the SUS-made mirror finished press plate 1b, the non-glare PET film 8b was arranged with the non-glare surface facing upward. Then, the acrylic hard film 15b carrying the hard coat layer 14b (with the hard coat layer 14b facing downward), the adhesive acrylic film 13b, the NMA plate 3b having near-infrared ray-shielding properties, the conductive mesh 42b, the adhesive acrylic film 51b, the acrylic film 6b, and the non-glare PET film 8b (with the non-glare surface facing downward) were arranged in this order. Finally, another mirror finished press plate was set over these members with its mirror finished surface facing downward. Then, the members were heated and pressed at 135° C. under a pressure of 40 kg/cm² for 20 minutes. Thereafter, the two non-glare PET films as embossing masters were removed to obtain a front panel for PDP, in which the hard coat layer 14b of the acrylic film 15b and the acrylic film 6b had the uneven patterns on each surface transferred from the surfaces of the non-glare PET films 8b, as shown in FIG. 6-b.

The conductive mesh 42b consisted of polyester fibers, which were thinly plated with copper and coated with a conductive black resin to suppress reflection. A mesh size thereof was 90×90 mesh, and a fiber diameter thereof was 40 μm. The acrylic film 15b carrying the hard coat layer 14b consisted of an acrylic film having a thickness of 125 μm to which an acrylic hard coat layer having a thickness of about 4 μm was provided. The acrylic film 6b, the non-glare films 8b, the MMA plate 3b and the adhesive acrylic film 51b were the same as those used in Example 1-b. Furthermore, the length and width of the acrylic film 6b and the adhesive acrylic film 51*b* were each about 20 mm smaller than those of the conductive mesh 42*b*, like in Example 1-b.

Accordingly, the conductive mesh was exposed in the plane of the front panel on the entire marginal sides of the front panel in a width of about 10 mm, and was embedded in the central part of the front panel to a depth of about 140 $\mu$m from the surface on the mesh side.

The warp of this front panel was about 10 mm.

The obtained front panel was attached to the screen of PDP in the same way as in Example 1-b. The front panel had as good electromagnetic wave-shielding and near-infrared ray-shielding properties as those of Example 1-b.

No Newton's ring was generated by the uneven patterns formed on the mesh side of this front panel like Example 1-b. On the viewer side, the reflection of the screen was suppressed by the non-glare surface which was transferred onto the hard coat. In addition, the blurring of the screen was not observed, and good visibility was attained, although the both surfaces of the front panel were subjected to the non-glare treatment. The front panel had good surface hardness, and had no scratch in the practical use.

To impart antistatic properties to the surface of the front panel, an antistatic coating material comprising surfactants (NONDUST (trade name) manufactured by COLCOAT) was applied to both the viewer and mesh side surfaces of the front panel so that a surface resistivity became $8 \times 10^{10}$ $\Omega$/square. The obtained front panel absorbed few dusts in use, and thus it could maintain good visibility for a long time.

Example 4-b

Figure 7D:
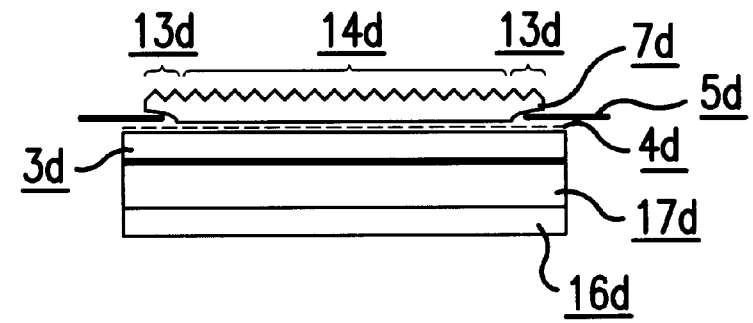
FIG. 7-*b* shows a layer arrangement in the course of heat press processing in Example 4-b.
Figure 7B:
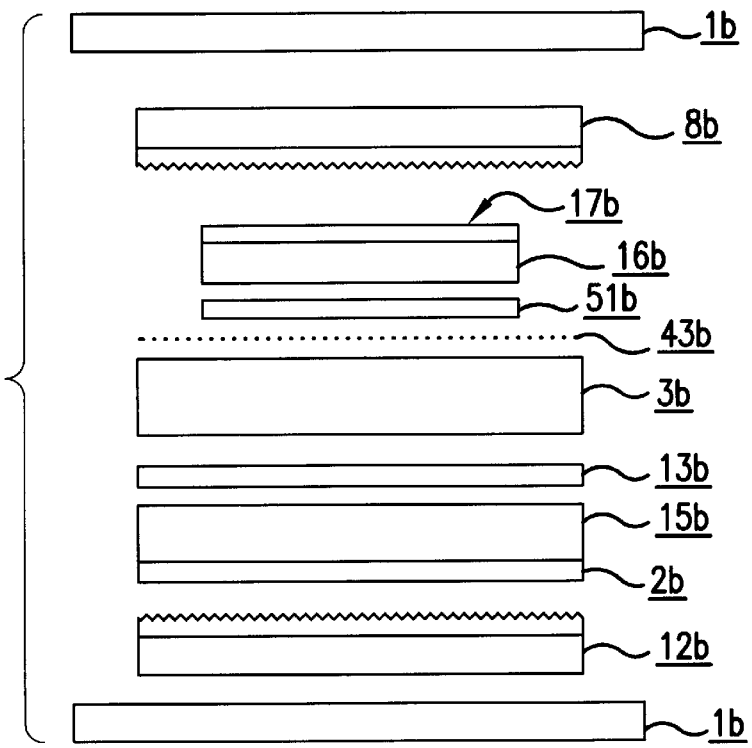
Figure 8B:
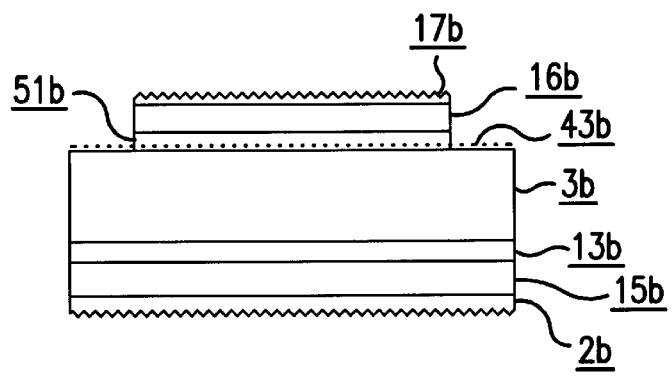
FIG. 8-*b* is a cross sectional view showing the layer structure of a front panel for a plasma display panel produced in Example 4-b.
Figure 7C:
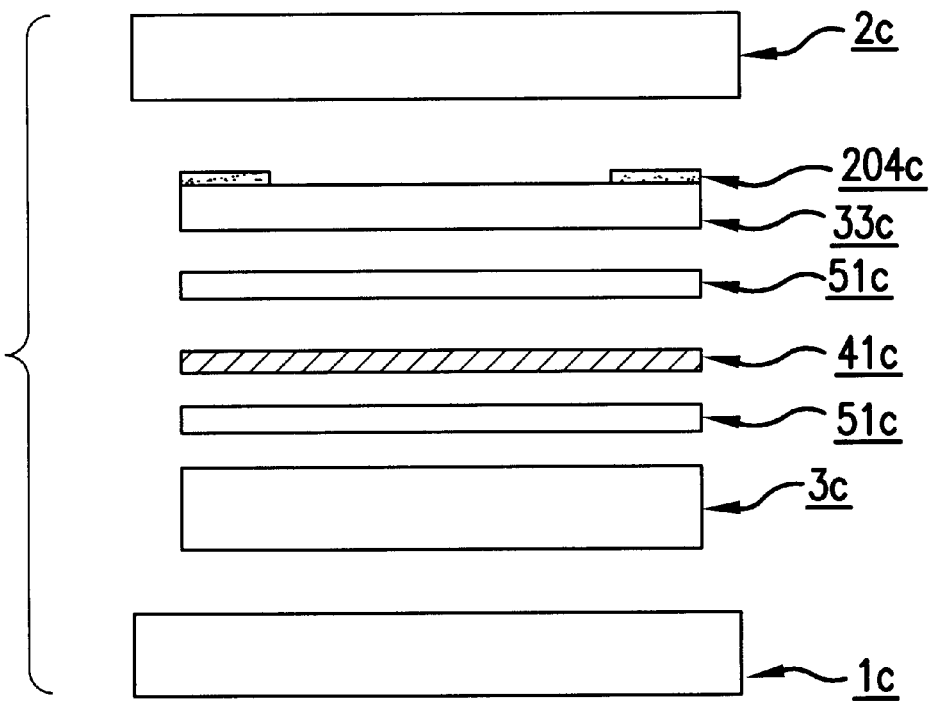
Figure 8C:
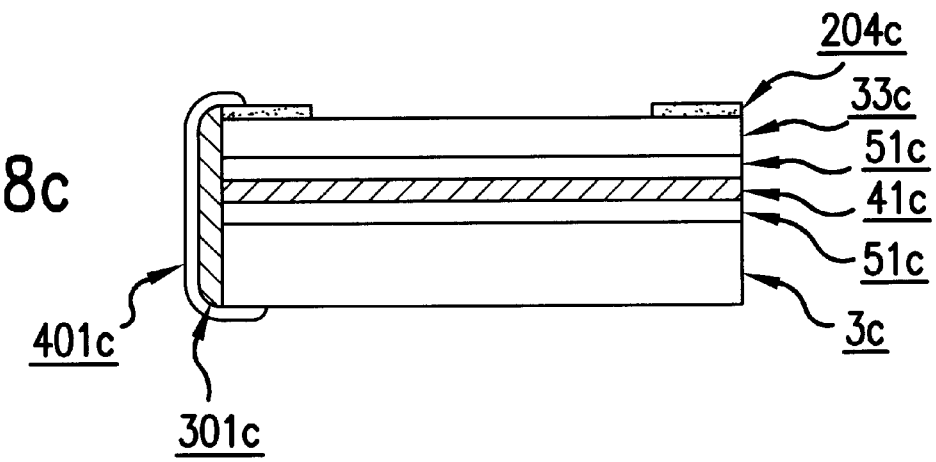
Figure 8D:
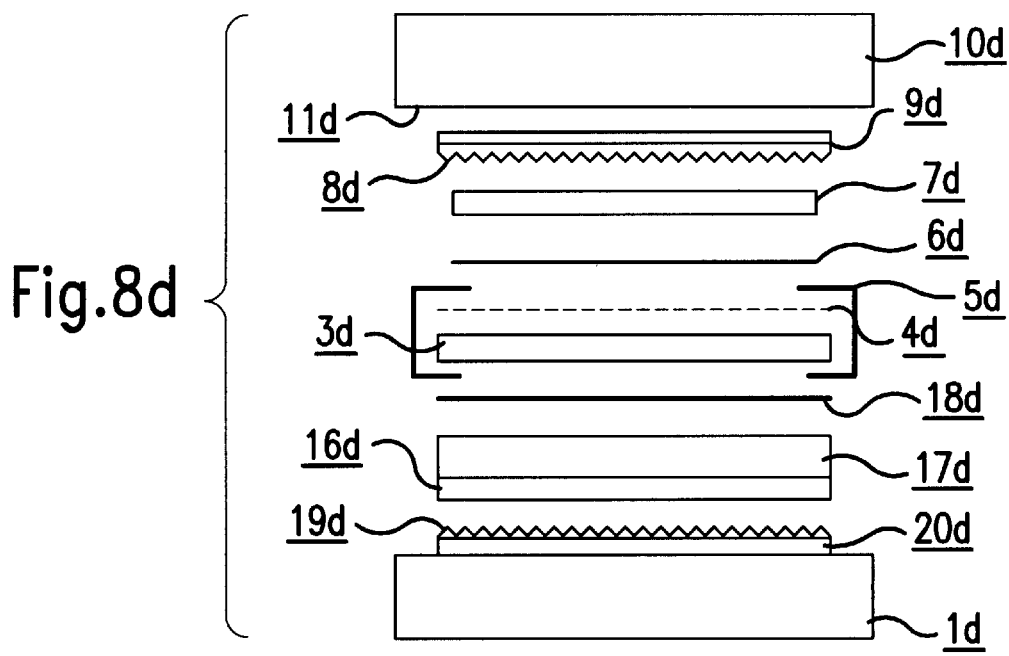

As shown in FIG. 7-*b*, on the SUS-made mirror finished press plate 1*b*, the non-glare PET film 12*b* (with the non-glare surface facing upward), the acrylic film 15*b* carrying the hard coat layer 2*b* (with the hard coat layer 2*b* facing downward), the adhesive acrylic film 13*b*, the MMA plate 3*b* having near-infrared ray-shielding properties, the conductive mesh 43*b*, the adhesive acrylic film 51*b*, the acrylic film 16*b* carrying the hard coat layer 17*b* (with the hard coat layer 17*b* facing upward) and the non-glare PET film 8*b* (with the non-glare surface facing downward) were arranged in this order. Finally, another mirror finished press plate was set over the these members. Then, the members were heated and pressed at 135° C. under a pressure of 40 kg/cm². Thereafter, the non-glare PET films on the mesh and viewer sides were removed to obtain a front panel for PDP, in which the hard coat layers 2*b*, 17*b* of the acrylic films 15*b*, 16*b* had the uneven patterns transferred from the non-glare surfaces of the PET films 12*b*, 8*b*, as shown in FIG. 8-*b*.

The acrylic films 15*b*, 16*b* carrying the hard coat layers 2*b*, 17*b* consisted of a transparent acrylic film having a glass transition temperature of 105° C. and a thickness of 125 $\mu$m and having one surface to which an acrylic hard coat layer having a thickness of 5 $\mu$m was provided.

The conductive mesh 43*b* consisted of polyester fibers, which were thinly plated with copper and coated with a conductive black resin to suppress reflection. A mesh size, which is the number of squares in mesh per one inch, thereof was 140×140 mesh, and a fiber diameter thereof was 40 $\mu$m.

The non-glare PET films 8*b*, 12*b* were the same as those used in Examples 1-b and 2-b, and the MMA plate 3*b* and the adhesive acrylic film 13*b* were the same as those used in Example 1-b. Furthermore, the length and width of the acrylic film 16*b* and the adhesive acrylic film 51*b* were each about 20 mm smaller than those of the conductive mesh, like in Example 1-b, while the size of the acrylic film 15*b* carrying the hard coat layer 2*b* was the same as that of the MMA plate 3*a*.

Accordingly, the conductive mesh 43*b* was exposed in the plane of the front panel on the entire marginal sides of the front panel in a width of 10 mm, and was embedded in the central part of the front panel to a depth of about 140 $\mu$m from the surface on the mesh side.

The warp of this front panel was about 10 mm.

The obtained front panel was attached to the screen of PDP in the same way as in Example 1-b. The front panel had as good electromagnetic wave-shielding and near-infrared ray-shielding properties as those of Example 1-b.

No Newton's ring was observed. In addition, the front panel had good durability and the non-glare surfaces were less changed by the heat generated by PDP or the warp of the front panel, since the mesh side surface had the hard coat layer having the uneven patterns. Thus, the front panel had good durability. Also, the viewer side surface had good surface hardness, and had no scratch in the practical use, and the front panel had good visibility.

To impart antistatic properties to the surface of the front panel, an antistatic coating material comprising surfactants (NONDUST (trade name) manufactured by COLCOAT) was applied to the mesh side surface of the front panel so that a surface resistivity became $5 \times 10^{9}$ $\Omega$/square. The obtained front panel could suppress the accumulation of dusts on the mesh side in use for a long time.

Example 5-b

As shown in FIG. 9-*b*, using the same press machine as that used in Example 1-b, on the SUS-made mirror finished press plate 1*b*, the transparent MMA plate 32*b*, the adhesive acrylic film 51*b*, the conductive mesh 41*b*, the adhesive acrylic film 51*b*, the transparent MMA plate 33*b* and another SUS-made mirror finished plate were arranged in this order. Then, the members were heated and pressed at 130° C. under a pressure of 40 kg/cm² to integrate them.

The MMA plate 32*b* was a cast plate having a thickness of 3 mm, while the MMA plate 33*b* was an extruded plate having a thickness of 1 mm. The conductive mesh 41*b* and the adhesive acrylic film 51*b* were the same as those used in Example 1-b.

The length and width of the transparent MMA plate 33*b* and adhesive acrylic film 51*b* were each about 20 mm smaller than those of the conductive mesh.

Figure 10B:
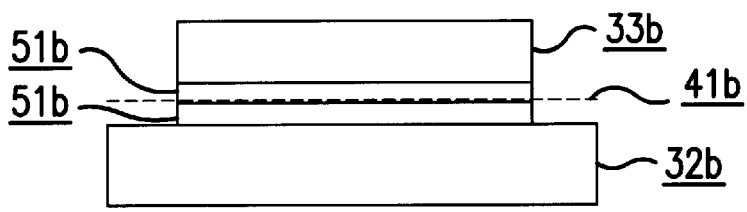
FIG. 10-*b* is a cross sectional view showing the layer structure of a front panel for a plasma display panel produced in Example 5-b.
Figure 1C:
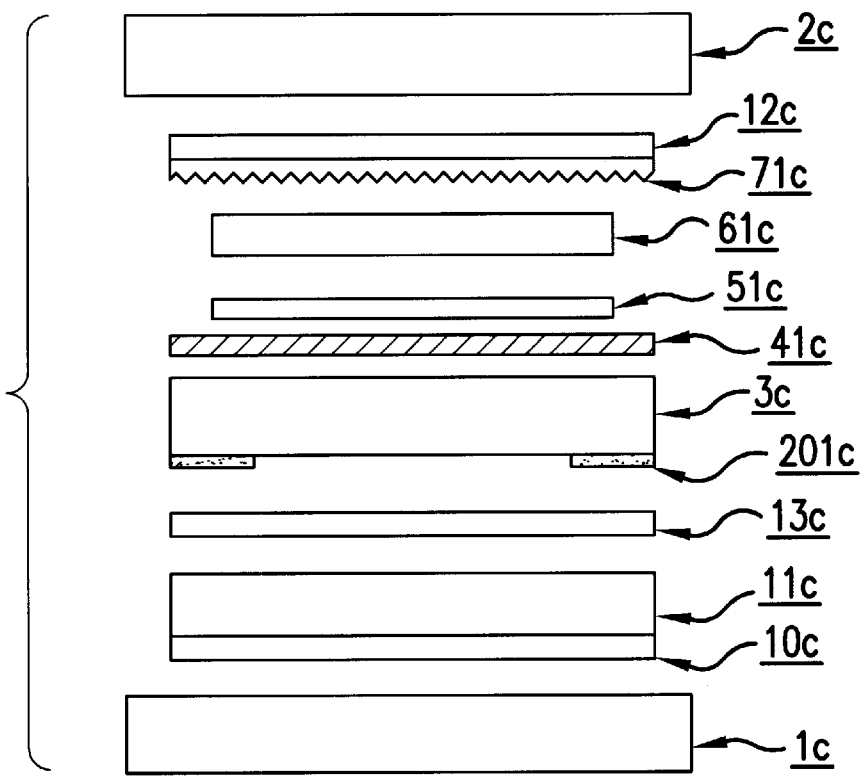
Figure 2C:
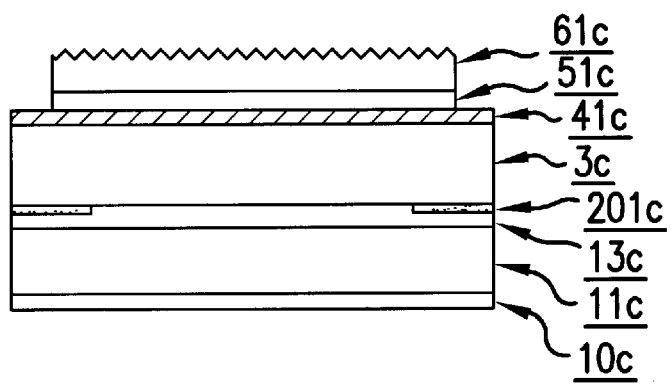
Figure 1D:
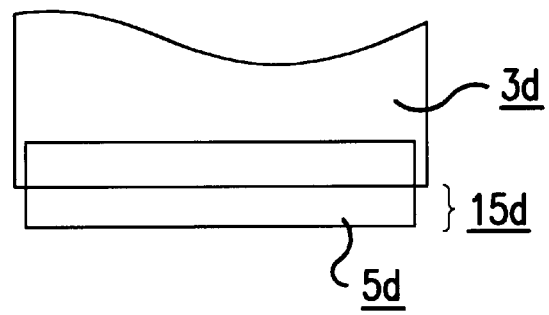
Figure 2D:
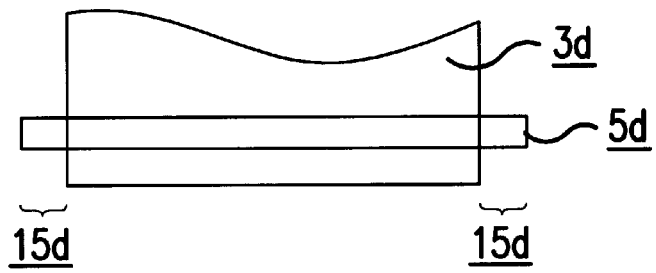
Figure 10D:
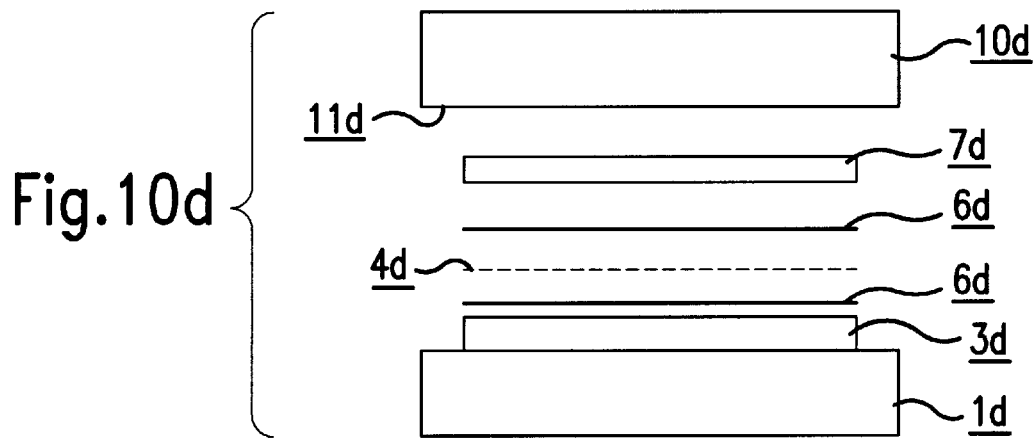

Accordingly, the conductive mesh was exposed in the plane of the front panel on the marginal sides of the front panel in a width of 10 mm, and was embedded in the central part of the front panel to a depth of about 1 mm from the surface on the mesh side, as shown in FIG. 10-*b*.

The obtained front panel was attached to the screen of PDP in the same way as in Example 1-b. The front panel had as good electromagnetic wave-shielding properties as those of Example 1-b.

However, the obtained front panel was warped by 25 mm with the acrylic plate 33*b* on the mesh side being convexed.

Furthermore, this front panel was attached to PDP in the same way as in Example 1-b. As a result, Newton's rings were observed, and the surface on the viewer side was easily scratched.

Example 1-c

As shown in FIG. 1-*c*, on the SUS-made mirror finished press plate 1*c*, the acrylic film 11*c* carrying the hard coat layer 10c (with the hard coat layer 10c facing downward), the adhesive acrylic film 13c, the transparent resin plate 3c, the conductive mesh 41c, the adhesive acrylic film 51c, the acrylic film 61c and the non-glare PET film 12c (with the non-glare surface 71c facing downward) were arranged in this order. Finally, the mirror finished press plate 2c was set over these members with the mirror finished surface facing downward. Then, the members were heated and pressed at 130° C. under a pressure of 40 kg/cm$^2$ for 20 minutes. Thereafter, the non-glare PET film 12c as a embossing master was removed to obtain a front panel, in which the surface of the acrylic film 61c had the uneven patterns transferred from the PET film as shown in FIG. 2-c.

The printed portion 201c was formed by printing in black in a width of 30 mm on the marginal surface of the transparent resin plate 3c and then printing white letters on the black printed portion, using acrylic inks.

The acrylic film 61c had a glass transition temperature of 105° C. and a thickness of 250 μm.

The non-glare PET film consisted of a PET film substrate having a thickness of 188 μm and a hard coat layer having a surface on which non-glare surface was formed by embossing.

The acrylic film 11c carrying the hard coat layer 10c consisted of an acrylic film having a thickness of 250 μm to which an acrylic urethane hard coat layer having a thickness of about 4 μm was provided.

The conductive mesh 41c consisted of polyester fibers (manufactured by TAKASE METAX Co., Ltd.) which were thinly plated with copper and coated with a conductive black resin to suppress reflection. A mesh size thereof was 100× 100 mesh, and a fiber diameter thereof was 40 μm.

The transparent resin plate 3c consisted of a resin plate having near-infrared ray-shielding properties (thickness, 3 mm; polymethyl methacrylate; cast plate). The hard coat layer 10c of the acrylic film 11c was a UV-curable type, and had a thickness of 4 μm.

The adhesive acrylic films 13c, 51c were soft acrylic films (SUNDUREN manufactured by KANEKA CORPORATION) each having a thickness of 50 μm The length and width of the acrylic film 61c and adhesive acrylic film 51c were each about 20 mm smaller than those of the conductive mesh 41c, while the sizes of the conductive mesh 41c, the adhesive acrylic film 13c and the acrylic film 11c were the same as those of the transparent resin plate 3c.

Accordingly, the conductive mesh 41c was exposed in the plane of the front panel on the entire marginal sides of the front panel in a width of 10 mm. The conductive mesh 41c except the marginal exposed part was embedded in the front panel to a depth of about 260 μm from the mesh side surface.

When the obtained front panel was attached to the screen of PDP, the screen was well defined with the black print on the marginal surface, and looked attractive.

Since the panel was set so that the mesh side surface thereof faced the PDP screen, the marginal exposed part of the mesh was hidden with the printed portion, and thus could not be seen from the front side. Since the printed portion was arranged on the viewer side of both of the mesh and the resin plate having near-infrared ray-shielding properties, clear printed colors were maintained, and furthermore the printed portion had good durability. In addition, when the marginal exposed part of the mesh was connected to a ground potential level, the obtained front panel had good electromagnetic wave-shielding properties. Thus, the leak of electromagnetic waves was greatly decreased, and the radiation of near-infrared rays from PDP was well shielded.

Example 2-c

As shown in FIG. 3-c, on the SUS-made mirror finished press plate 1c, the non-glare PET film 8c was set with the non-glare surface 72c facing upward. Then, on the non-glare PET film 8c, the acrylic film 15c carrying the hard coat layer 14c (with the hard coat layer 14c facing downward), the acrylic film 23c, the transparent resin plate 3c, the conductive mesh 42c, the adhesive acrylic film 51c, the acrylic film 6c and the non-glare PET film 12c (with the non-glare surface 72c facing downward) were arranged in this order. In addition, a copper metal thin film 101c was arranged on the entire marginal sides of the conductive mesh 42c so that the width of about 10 mm of the metal thin film overlapped with the underside surface of the adhesive acrylic film 51c. Finally, the mirror finished press plate 2c was arranged on the members with the mirror finished surface facing downward. Then, the members were heated and pressed at 135° C. under a press pressure of 40 kg/cm$^2$ for 20 minutes. Thereafter, the two non-glare PET films 8c, 12c as embossing masters were removed to obtain a front panel, in which both of the hard coat layer on the acrylic film and the other acrylic film had uneven patterns on each surface transferred from the non-glare surfaces of the non-glare PET films, as shown in FIG. 4-c.

The printed portion 202c was formed by printing in black in a width of 25 mm on the marginal surface of the acrylic film 23c and then printing white letters on a part of the black printed portion, using acrylic inks.

The copper metal thin film 101c was in a tape form having a width of 20 mm and a thickness of 20 μm, and cut in a suitable length so that it could be placed on the entire marginal sides of surface of the mesh.

The conductive mesh 42c consisted of polyester fibers, which were thinly plated with copper and coated with a conductive black resin to suppress reflection. A mesh size thereof was 90×90 mesh, and a fiber diameter thereof was 40 μm.

The acrylic film 15c carrying the hard coat layer 14c consisted of an acrylic film having a thickness of 125 μm to which an acrylic hard coat layer having a thickness of about 4 μm was provided.

The acrylic film 6c had a thickness of 125 μm.

The non-glare PET films 8c, 12c each consisted of a PET film having a thickness of 188 μm, and each had uneven patterns on its one side of surfaces which were formed by embossing.

The transparent resin plate 3c and the adhesive acrylic film 51c were the same as those used in Example 1-c.

The length and width of the acrylic film 6c and the adhesive acrylic film 51c were each about 20 mm smaller than those of the conductive mesh, while the sizes of the conductive mesh 42c and the acrylic films 23c, 15c were the same as those of the transparent resin plate 3c.

The copper thin film 101c was exposed in the plane of the front panel on the entire marginal sides of surface of the front panel in a width of about 10 mm while overlapping with the conductive mesh 4c.

The conductive mesh 42c except the part on which the copper thin film was provided was embedded to a depth of about 140 μm from the mesh side surface of the panel.

The obtained front panel was attached to the screen of PDP in the same way as in Example 1-c. The copper thin film was hidden with the black printing of the printed portion on the marginal surface of the front panel, and thus could not be seen from the viewing side. Further, the printed colors were clear, and the decoration effect of the screen was sufficient. The front panel had as good electromagnetic wave-shielding and near-infrared ray-shielding properties as those of Example 1-c.

An antistatic coating material comprising surfactants (NONDUST (trade name) manufactured by COLCOAT) was applied to both the mesh and viewer side surfaces of the front panel so that a surface resistivity became $8 \times 10^{10}$ Ω/square. The obtained front panel could suppress the adsorption of dusts on the surfaces, and thus the front panel could have good visibility for a long time.

Example 3-c

As shown in FIG. 5-c, on the SUS-made mirror finished press plate 1c, the non-glare PET film 12c (with the non-glare surface 72c facing upward), the acrylic film 15c carrying the hard coat layer 14c (with the hard coat layer 14c facing downward), the adhesive acrylic film 13c, the transparent resin plate 3c, the conductive mesh 43c, the adhesive acrylic film 51c, the acrylic film 16c carrying the hard coat layer 17c (with the hard coat layer 17c facing upward) and the non-glare PET film 8c (with the non-glare surface 72c facing downward) were arranged in this order. In addition, a copper metal thin film 104c was arranged on the entire marginal sides area of the conductive mesh so that the width of about 5 mm of the metal thin film overlapped with the underside surface of the adhesive acrylic film 51c. Finally, the mirror finished press plate 2c was arranged on the members with the mirror finished surface facing downward. Then, the members were heated and pressed at 135° C. under a press pressure of 40 kg/cm². Thereafter, the two non-glare PET films 8c, 12c as embossing masters were removed from the mesh and viewer side surfaces to obtain a front panel, in which the hard coat layers of the acrylic films 15c, 16c carrying the hard coat layers 14c, 17c had uneven patterns on each surface transferred from the non-glare surfaces of the non-glare PET films, as shown in FIG. 6-c.

The copper metal thin film 104c was in a tape form having a width of 15 mm and a thickness of 15 μm, and cut in a suitable length so that it could be placed on the entire marginal sides of surface of the mesh.

The acrylic film 15c carrying the hard coat layer 14c was the same as that used in Example 2-c.

The printed portion 203c was formed by printing in black on the marginal surface of the acrylic film 15c in a width of 25 mm, using acrylic inks.

The acrylic films 15c, 16c carrying the hard coat layers consisted of an acrylic film having a glass transition temperature of 105° C. and a thickness of 125 μm to which an acrylic hard coat layer having a thickness of about 5 μm was provided. The conductive mesh 43c consisted of polyester fibers, which were thinly plated with copper and coated with a conductive black resin to suppress reflection. A mesh size thereof was 140×140 mesh, and a fiber diameter thereof was 40 μm. The non-glare PET films 8c, 12c were the same as those used in Examples 2-c and 1-c, while the transparent resin plate 3c and the adhesive acrylic film 51c were the same as those used in Example 1-c.

The length and width of the acrylic film 16c and the adhesive acrylic film 51c were each about 20 mm smaller than those of the conductive mesh 43c, while the sizes of the conductive mesh 43c, the adhesive acrylic film 13c and acrylic film 15c were the same as those of the transparent resin plate 3c.

The copper thin film 104c was exposed in the plane of the front panel on the entire marginal sides of surface of the front panel in a width of about 10 mm. The conductive mesh 43c except the part on which the copper thin film was provided was embedded to a depth of about 140 μm from the mesh side surface, which corresponded to about the total thickness of the acrylic film 16c and a part of the adhesive acrylic film 51c.

The obtained front panel was attached to the screen of PDP in the same way as in Example 1-c. The copper thin film was hidden with the black printing on the marginal surface of the front panel, and thus could not be seen from the viewing side. Furthermore, the printed colors were clear, and the decoration effect of the screen was sufficient. The front panel had as good electromagnetic wave-shielding and near-infrared ray-shielding properties as those of Example 1-c.

To impart antistatic properties to the front panel, an antistatic coating material comprising surfactants (NONDUST (trade name) manufactured by COLCOAT) was applied to the mesh side surface of the front panel so that a surface resistivity became $5 \times 10^9$ Ω/square. The obtained front panel could suppress the accumulation of dusts on the mesh side surface in use for a long time.

Comparative Example 1-c

As shown in FIG. 7-c, using the same press machine as that used in Example 1-c, on the SUS-made mirror finished press plate 1c, the transparent resin plate 3c having near-infrared ray-shielding properties, the adhesive acrylic film 51c, the conductive mesh 41c, another adhesive acrylic film 51c, the transparent MMA plate 33c and another SUS-made mirror finished plate 2c were placed in this order. Then, the members were heated and pressed at 130° C. under a pressure of 40 kg/cm² to integrate them.

The printed portion 204c was formed by printing in black in a width of 10 mm on the marginal surface of the transparent resin plate 33c and then printing white letters on a part of the black printed portion.

The transparent resin plate 33c was an extruded plate (of polymethacrylate) having a thickness of 1 mm, while the conductive mesh 41c and the adhesive acrylic films 51c were the same as those used in Example 1-c. The transparent resin plates 3c, 33c, the adhesive acrylic films 51c and conductive mesh 41c had the same length and width. After pressing, all the marginal sides of the produced panel was cut by a width of about 10 mm, and a conductive paste 301c (DOUGHTIGHT D-500 manufactured by FUJIKURA KASEI Co., Ltd.) was applied on the side surfaces and dried. Then, onto the surfaces, the copper tape 401c was bonded to obtain a front panel. As shown in FIG. 8-c, in the obtained front panel, the conductive mesh 41c was embedded to a depth of about 1 mm from the mesh side surface (on the side at which the transparent resin plate 33c was placed), which corresponded to the total thickness of the transparent resin plate 33c and adhesive acrylic film 51c. Here, FIG. 8-c shows the conductive paste 301c and copper tape 401c only on the left cut side, while those on the right cut side are omitted.

This front panel was attached to the screen of PDP with the printed portion facing the display, and the copper tape 401c was connected to a ground potential level. However, the front panel had insufficient electromagnetic wave-shielding properties.

The printed portion had low contrast because of the influence of the conductive mesh and the transparent synthetic resin plate having near-infrared ray-shielding properties. Furthermore, the front panel was easily scratched,. and thus had unsatisfactory durability, since the printed portion was exposed on the display side surface.

Example 1-d

As shown in FIG. 4-d, on the SUS-made mirror finished press plate 1d, the transparent resin plate 3d (with the hard coat layer 2d facing downward), the conductive mesh 4d, the conductive film 5d, the adhesive film 6d, the transparent resin plate 7d and the non-glare film 9d (with the non-glare surface 8d facing downward) were arranged in this order. Finally, the mirror finished press plate 10d was arranged over the members with the mirror finished surface 11d facing downward. The conductive film 5d was arranged so that it overlapped with each of the adhesive film 6d and conductive mesh 4d on the entire marginal sides of a front panel in a width of about 10 mm. Then, the members were heated and pressed at a press temperature of 130° C. under a press pressure of 40 kg/cm$^2$ for 20 minutes. Thereafter, the non-glare film 9d was removed to obtain a front panel for a plasma display panel as shown in FIG. 5-d.

The transparent resin plate 3d was the cast plate of an acrylic resin having near-infrared ray-shielding properties and a thickness of 3 mm, and the hard coat layer 2d on its surface was a layer formed by curing an acrylic hard coating agent with UV rays and having a thickness of 4 μm.

The conductive mesh 4d consisted of polyester fibers, which were thinly plated with copper and coated with a conductive black resin to suppress reflection (manufactured by TAKASE METAX). A mesh size thereof was 100×100 mesh, and a fiber diameter thereof was 40 μm. The size of the conductive mesh 4d was substantially the same as that of the transparent resin plate 3d.

The conductive film 5d was a copper tape having a width of 20 mm and a thickness of 20 μm, and cut in a suitable length so that it could be placed on the entire marginal sides of the conductive mesh 4d.

The part 13d of the conductive film 5d, which overlapped with the adhesive film 6d, was perforated to form 5 holes each having a diameter of about 1 mm per one square centimeter (cm$^2$) of the conductive film. The total hole area was 3.9% of the whole surface area of the conductive film 5d.

A thermoplastic adhesive (HM type manufactured by PANAC) was coated in a thickness of about 20 μm on the side of surfaces of the conductive film 5d facing the transparent resin plate 3d. The above holes were formed to pass through the conductive film and the adhesive.

The adhesive film id was a soft acrylic film (SUNDUREN manufactured by KANEKA CORPORATION) having a thickness of 50 μm, and its length and width were each about 20 mm smaller than those of the transparent resin plate 3d.

The acrylic film 7d was an acrylic film having a glass transition temperature of 101° C. and a thickness of 125 μm, and its length and width were each about 20 mm smaller than those of the transparent resin plate 3d.

The non-glare film 9d consisted of a PET film having a thickness of 188 μm and carrying, on its surface, a hard coat layer which was embossed to form uneven patterns 8d (non-glare surface), and its size was substantially the same as that of the transparent resin plate 3d.

In the obtained front panel, the conductive film 5d was exposed on the plane of the front panel on the entire marginal sides of the front panel in a width of about 10 mm while overlapping with the conductive mesh 4d. Here, a side on which a conductive film is exposed is referred to as "mesh side".

The conductive film 5d overlapped with the conductive mesh 4d with being firmly bonded to each other in the regions 13d in which the conductive film 5d overlapped with the adhesive film 6d and transparent resin plate 7d. Furthermore, the conductive film 5d was firmly fixed with the transparent resin plate 3d, adhesive film 6d and transparent resin plate 7d.

The conductive mesh 4d was embedded to a depth of about 140 μm from the mesh side surface in the region 14d other than the part in which the mesh and the conductive film 5d was overlapped.

This front panel was attached to PDP with the mesh side facing the PDP while connecting the exposed part of the conductive film 5d to a ground potential level. Electromagnetic waves were effectively shielded, and also near-infrared rays emitted from the PDP were sufficiently shielded. In addition, no malfunction happened in the remote control of electric equipment.

When the front panel was allowed to be in contact with the display screen of the PDP, no Newton's ring was observed, and the visibility of the PDP screen was good. The surface opposite to the mesh side (hereinafter referred to "viewer side surface") had practically good surface hardness, and was not scratched in the practical use.

Example 2-d

As shown in FIG. 6-d, on the SUS-made mirror finished press plate 1d, the transparent resin plate 17d carrying the hard coat layer on its surface (with the hard coat layer 16d facing downward), the adhesive film 18d, the transparent resin plate 3d, the conductive mesh 4d, the conductive film 5d, the adhesive film 6d, the transparent resin plate 7d and the non-glare film 9d (with the non-glare surface 8d facing downward) were arranged in this order. Finally, the mirror finished press plate 10d was arranged over the members with the mirror finished surface 11d facing downward. The conductive film 5d was arranged so that it overlapped with each of the adhesive film 6d and conductive mesh 4d on the entire marginal sides of a front panel in a width of about 5 mm. Then, the members were heated and pressed at a press temperature of 130° C. under a press pressure of 40 kg/cm$^2$ for 20 minutes. Thereafter, the non-glare film 2d was removed to obtain a front panel as shown in FIG. 7-d.

The transparent resin plate 3d was the cast plate of an acrylic resin having near-infrared ray-shielding properties and a thickness of 3 mm.

The transparent resin plate 17d was an acrylic plate having a thickness of 250 μm, and the hard coat layer 16d on its surface was a layer formed by curing an acrylic urethane hard coating agent with UV rays and having a thickness of 4 μm. The size of the plate 17d was substantially the same as that of the transparent resin plate 3d.

The conductive mesh 4d consisted of polyester fibers, which were thinly plated with copper and coated with a conductive black resin to suppress reflection (manufactured by TAKASE METAX). A mesh size thereof was 100×100 mesh, and a fiber diameter thereof was 40 μm. The size of the conductive mesh 4d was substantially the same as that of the transparent resin plate 3d.

The conductive film 5d was an aluminum tape having a width of 15 mm and a thickness of 30 μm, and cut in a suitable length so that it could be placed on the entire marginal sides of the mesh.

A part of the conductive film 5d, which overlapped with the adhesive film 6d, was perforated to form 8 holes each having a diameter of about 0.7 mm per one square centimeter (cm$^2$) of the conductive film. The total hole area was 3.1% of the whole surface area of the conductive film 5d.

The adhesive films 6d, 18d were soft acrylic films (SUNDUREN manufactured by KANEKA CORPORATION) having a thickness of 50 µm. The length and width of the adhesive film 6d were each about 20 mm smaller than those of the transparent resin plate 3d, while the size of the adhesive film 18d was substantially the same as that of the transparent resin plate 3d.

The transparent resin plate 7d was an acrylic film having a glass transition temperature of 105° C. and a thickness of 250 µm, and its length and width were each about 20 mm smaller than those of the transparent resin plate 3d.

The non-glare film 9d consisted of a PET film having a thickness of 188 µm carrying, on its surface, a hard coat layer which was embossed to form uneven patterns 8d (non-glare surface), and its size was substantially the same as that of the transparent resin plate 3d.

In the obtained front panel, the conductive film 5d was exposed on the plane of the front panel on the entire marginal sides of the front panel in a width of about 10 mm. The conductive film 5d overlapped with the conductive mesh 4d with being firmly bonded to each other in the regions 13d in which the conductive film 5d overlapped with the adhesive film 6d and transparent resin plate 7d. Furthermore, the conductive film 5d was firmly fixed with the transparent resin plate 3d, adhesive film 6d and transparent resin plate 7d.

The conductive mesh 4d was embedded to a depth of about 260 µm from the mesh side surface in the region 14d other than the part in which the mesh overlapped with the conductive film 5d.

This front panel was attached to PDP with the mesh side facing the PDP while connecting the exposed part of the conductive film 5d to a ground potential level. Electromagnetic waves were effectively shielded, and also near-infrared rays emitted from the PDP were sufficiently shielded. In addition, no malfunction happened in the remote control of electric equipment.

When the front panel was allowed to be in contact with the display screen of the PDP, no Newton's ring was observed, and the visibility of the PDP screen was good. The viewer side surface had practically good surface hardness, and was not scratched in the practical use.

Example 3-d

As shown in FIG. 8-d, on the SUS-made mirror finished press plate 1d, the non-glare film 20d (with the non-glare surface 19d facing upward), the transparent resin plate 17d (with the hard coat layer 16d facing downward), the adhesive film 18d, the transparent resin plate 3d, the conductive mesh 4d, the conductive film 5d, the adhesive film 6d, the transparent resin plate 7d and the non-glare film 9d (with the non-glare surface 8d facing downward) were arranged in this order. Finally, the mirror finished press plate 10d was arranged over the members with the mirror finished surface 11d facing downward. The conductive film 5d was arranged so that it overlapped with each of the adhesive film 6d and conductive mesh 4d on the entire marginal sides of a front panel in a width of about 5 mm, and folded back beneath the transparent resin plate 3d in a width of about 5 mm. Then, the members were heated and pressed at a press temperature of 135° C. under a press pressure of 40 kg/cm$^2$ for 20 minutes. Thereafter, the non-glare films 9d, 20d were removed to obtain a front panel, as shown in FIG. 9-d. An antistatic agent comprising surfactants (NONDUST manufactured by COLCOAT) was applied to both of the mesh side and viewer side surfaces of the front panel.

The transparent resin plate 3d was the cast plate of an acrylic resin having near-infrared ray-shielding properties and a thickness of 3 mm.

The transparent resin plate 17d was an acrylic plate having a thickness of 250 µm, and the hard coat layer 16d on its surface was a layer formed by curing an acrylic hard coating agent with UV rays and having a thickness of 4 µm. The size of the plate 17d was substantially the same as that of the transparent resin plate 3d.

The conductive mesh 4d consisted of polyester fibers, which were thinly plated with copper and coated with a conductive black resin. A mesh size thereof was 90×90 mesh, and a fiber diameter thereof was 40 µm. The size of the conductive mesh 4d was substantially the same as that of the transparent resin plate 3d.

The conductive film 5d was an copper tape having a width of 19 mm and a thickness of 15 µm, and cut in a suitable length so that it could be placed on the entire marginal sides of the conductive mesh.

A part of the conductive film 5d, which overlapped with the adhesive film 6d, was perforated to form 25 holes each having a diameter of about 1.0 mm per one square centimeter (cm$^2$) of the conductive film. The total hole area was 19.6% of the whole surface area of the conductive film 5d.

The adhesive films 6d, 18d were soft acrylic films (SUNDUREN manufactured by KANEKA CORPORATION) having a thickness of 50 µm. The length and width of the adhesive film 6d were each about 20 mm smaller than those of the transparent resin plate 3d, while the size of the adhesive film 18d was substantially the same as that of the transparent resin plate 3d.

The transparent resin plate 7d was an acrylic film having a glass transition temperature of 101° C. and a thickness of 125 µm, and its length and width were each about 20 mm smaller than those of the transparent resin plate 3d.

The non-glare films 9d, 20d each consisted of a PET film having a thickness of 188 µm carrying, on its surface, a hard coat layer which was embossed to form uneven patterns 8d, 19d (non-glare surface), and their size was substantially the same as that of the transparent resin plate 3d.

In the obtained front panel, the conductive film 5d was exposed in the plane of the front panel on the entire marginal sides of the front panel in a width of about 10 mm while overlapping with the conductive mesh 4d. The conductive film 5d overlapped with the conductive mesh 4d with being firmly bonded to each other in the regions 13d in which the conductive film 5d overlapped with the adhesive film 6d and transparent resin plate 7d. Furthermore, the conductive film 5d was firmly fixed with the transparent resin plate 3d, the adhesive film 6d and the transparent resin plate 7d.

In addition, the conductive film 5d was folded back between the transparent resin plate 3d and the transparent resin plate 17d, and thus it was more firmly fixed to the front panel.

The conductive mesh 4d was embedded to a depth of about 140 µm from the mesh side surface in the region 14d other than the part in which the mesh overlapped with the conductive film 5d.

The front panel had a surface resistivity of 8×10$^{10}$ Ω/square.

This front panel was attached to PDP with the mesh side facing the PDP while grounding the exposed part of the conductive film 5d. Electromagnetic waves were effectively shielded, and also near-infrared rays emitted from the PDP were sufficiently shielded. Thus, no malfunction happened in the remote control of electric equipment.

When the front panel was allowed to be in contact with the display screen of the PDP, no Newton's ring was observed, and the visibility of the PDP screen was good. The surface on the viewer side had practically good surface hardness, and was not scratched in the practical use. In addition, dusts did not adhere to the front panel in use for a long time.

Comparative Example 1-d

As shown in FIG. 10-d, on the SUS-made mirror finished press plate 1d, the transparent resin plate 3d, the adhesive film 6d, the conductive mesh 4d, the adhesive film 6d and the transparent resin plate 7d were arranged in this order. Finally, the mirror finished press plate 10d was arranged over the members with the mirror finished surface 11d facing downward. Then, the members were heated and pressed at a press temperature of 130° C. under a press pressure of 40 kg/cm$^2$ for 20 minutes to obtain a front panel.

Figure 11D:
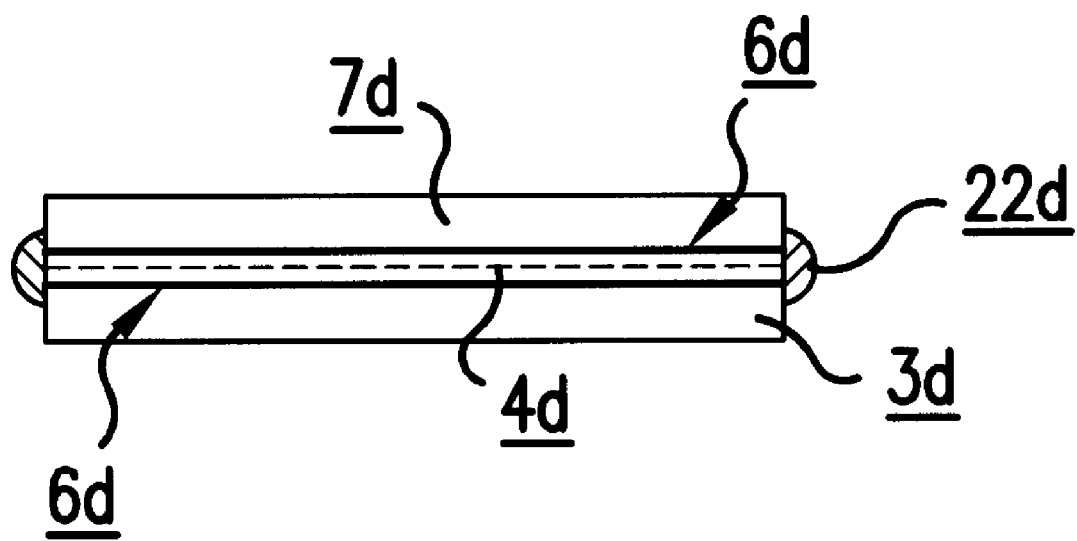
FIG. 11-d is a cross sectional view showing the layer structure of a front panel produced in Comparative Example 1-d.

The four sides of this front panel were cut by a width of 1 to 4 mm to make them even. Then, the conductive paste 22d was applied to the side faces so that it was in contact with the conductive mesh 4d, as shown in FIG. 11-d.

The transparent resin plate 3d was the cast plate of an transparent acrylic resin having a thickness of 3 mm.

The adhesive film 6d was a soft acrylic film (SUNDUREN manufactured by KANEKA CORPORATION) having a thickness of 50 μm, and its size was substantially the same as that of the transparent resin plate 3d.

The conductive mesh 4d was the same as the conductive mesh used in Example 1-d (manufactured by TAKASE METAX; a mesh size: 100×100 mesh; a fiber diameter: 40 μm), and its size was substantially the same as that of the transparent resin plate 3d.

The transparent resin plate 7d was an extruded plate of a transparent acrylic resin having a thickness of 1 mm, and its size was substantially the same as that of the transparent resin plate 3d.

The conductive paste 22d was DOUGHTIGHT D-500 (manufactured by FUJIKURA KASEI Co., Ltd.).

In the obtained front panel, the conductive mesh 4d was embedded to a depth of about 1 mm from the surface of the transparent resin plate 7d.

This front panel was attached to PDP while grounding the conductive paste 22d, but electromagnetic waves could not effectively be shielded.

When the front panel was allowed to be in contact with the display screen of the PDP, Newton's rings were observed, and the visibility of the PDP screen was not good. The surface on the viewer side was easily scratched in the practical use.

What is claimed is:

1. A front panel for plasma display panel comprising at least one transparent resin plate and a conductive mesh placed on said transparent resin plate, wherein a part of the conductive mesh is exposed on the plate in a sheet form on at least one side of the marginal surface of the front panel, wherein said conductive mesh covers at least a central part of said transparent resin plate and is embedded to a depth of 0.5 mm or less from either side of surfaces of the front panel.

2. A front panel for a plasma display panel according to claim 1, wherein said conductive mesh is exposed on the plate in a sheet form on the four sides of the marginal surface of the front panel.

3. A front panel for a plasma display panel according to claim 1, which further comprises an intermediate synthetic resin plate between said conductive mesh and said transparent resin plate, and a decorative portion between said intermediate synthetic resin plate and said transparent resin plate.

4. A front panel for a plasma display panel according to claim 3, wherein said decorative portion covers the exposed part of said conductive mesh.

5. A front panel for a plasma display panel according to claim 3, wherein said decorative portion is formed by printing.

6. A front panel for a plasma display panel according to claim 3, which further comprises a conductive film, and said decorative portion covers said conductive film.

7. A front panel for a plasma display panel according to claim 1, which further comprises a conductive film, a part of which is in contact with said conductive mesh in a sheet form on at least one side of the marginal surface of the front panel.

8. A front panel for a plasma display panel according to claim 7, wherein said conductive film is perforated.

9. A front panel for a plasma display panel according to claim 1, wherein said transparent resin plate has properties of shielding near-infrared rays.

10. A front panel for a plasma display panel according to claim 9, wherein said transparent resin plate comprises a resin composition comprising a copolymer prepared by copolymerizing a monomer having an unsaturated double bond and a phosphorus atom-containing monomer, and a compound containing a copper atom.

11. A front panel for a plasma display panel according to claim 9, wherein said transparent resin plate contains a dye type near-infrared absorber.

12. A front panel for a plasma display panel according to claim 1, which has uneven patterns on at least one side of surfaces of the front panel.

13. A front panel for a plasma display panel according to claim 12, wherein said uneven patterns are formed by transferring the patterns from an embossing master.

14. A front panel for a plasma display panel according to claim 12, wherein said uneven patterns are formed by transferring the uneven patterns from an embossing master, and said embossing master is a film having a surface on which uneven patterns are formed.

15. A front panel for a plasma display panel according to claim 12, wherein one side of surfaces of the front panel has uneven patterns, and the other side carries a hard coat layer.

16. A front panel for a plasma display panel according to claim 12, which has a hard coat layer on at least one side of surfaces of the front panel, and uneven patterns are formed on the side having the hard coat layer.

17. A front panel for a plasma display panel according to claim 12, wherein said uneven pattern has Average Spacing of Roughness peaks in a range between 3 and 500 μm, and Ten point height of irregularities in a range between 1 and 20 μm.

18. A front panel for a plasma display according to claim 17, wherein said uneven patterns are formed by transferring the patterns from an embossing master.

19. A front panel for a plasma display panel according to claim 17, wherein said uneven patterns are formed by transferring the uneven patterns from an embossing master, and said embossing master is a film having a surface on which uneven patterns are formed.

20. A front panel for a plasma display panel according to claim 17, wherein one side of surfaces of the front panel has uneven patterns, and the other side carries a hard coat layer.

21. A front panel for a plasma display panel according to claim 17, which has a hard coat layer on at least one side of surfaces of the front panel, and uneven patterns are formed on the side having the hard coat layer.

22. A plasma display panel, on the front face thereof, having a front panel comprising at least one transparent resin plate and a conductive mesh placed on said transparent resin plate, in which a part of the conductive mesh is exposed on the plate in a sheet form on at least one side of the marginal surface of the front panel, wherein said conductive mesh covers at least a central part of said transparent resin plate and is embedded to a depth of 0.5 mm or less from either side of surfaces of the front panel.

* * * * *

UNITED STATES PATENT AND TRADEMARK OFFICE
CERTIFICATE OF CORRECTION

PATENT NO. : 6,417,619 B1
DATED : July 9, 2002
INVENTOR(S) : Yukio Yasunori et al.

It is certified that error appears in the above-identified patent and that said Letters Patent is hereby corrected as shown below:

<u>Title page,</u>
Item [54], please change the title from "FRONT PANEL BOARD FOR PLASMA DISPLAY" to -- FRONT PANEL FOR PLASMA DISPLAY --.

Signed and Sealed this

Eighth Day of April, 2003

JAMES E. ROGAN
*Director of the United States Patent and Trademark Office*